United States Patent
Kwon

(10) Patent No.: US 11,069,623 B2
(45) Date of Patent: Jul. 20, 2021

(54) SEMICONDUCTOR PACKAGE

(71) Applicant: Samsung Electronics Co., Ltd., Suwon-si (KR)

(72) Inventor: Heungkyu Kwon, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 132 days.

(21) Appl. No.: 16/385,089

(22) Filed: Apr. 16, 2019

(65) Prior Publication Data

US 2019/0355667 A1    Nov. 21, 2019

(30) Foreign Application Priority Data

May 15, 2018  (KR) .................. 10-2018-0055446
May 21, 2018  (KR) .................. 10-2018-0057769
May 23, 2018  (KR) .................. 10-2018-0058343
Oct. 2, 2018   (KR) .................. 10-2018-0117775

(51) Int. Cl.
| | |
|---|---|
| *H01L 23/538* | (2006.01) |
| *H01L 21/48* | (2006.01) |
| *H01L 21/56* | (2006.01) |
| *H01L 23/31* | (2006.01) |
| *H01L 23/00* | (2006.01) |
| *H01L 25/10* | (2006.01) |
| *H01L 25/00* | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 24/16* (2013.01); *H01L 24/48* (2013.01); *H01L 25/105* (2013.01); *H01L 25/50* (2013.01); *H01L 2224/16227* (2013.01); *H01L 2224/48227* (2013.01); *H01L 2225/1035* (2013.01); *H01L 2225/1041* (2013.01); *H01L 2225/1058* (2013.01); *H01L 2924/19105* (2013.01)

(58) Field of Classification Search
CPC .......... H01L 23/49822; H01L 23/5383; H01L 23/49833; H01L 23/5385; H01L 25/043; H01L 25/0657; H01L 25/074; H01L 25/0756; H01L 25/117; H01L 25/06503; H01L 25/06596
See application file for complete search history.

(56) References Cited

U.S. PATENT DOCUMENTS 7,872,356 B2   1/2011   Sanchez et al.
8,193,644 B2   6/2012   Takahashi
(Continued)

FOREIGN PATENT DOCUMENTS

JP    5420671 B2    2/2014

*Primary Examiner* — Joseph M Galvin, III
(74) *Attorney, Agent, or Firm* — Harness, Dickey & Pierce, P.L.C

(57) ABSTRACT

Provided is a semiconductor package. The semiconductor package may include a substrate, a semiconductor chip on the substrate, a passive element on the substrate, a conductive structure on the substrate, and an interposer substrate on the semiconductor chip, the passive element, and the conductive structure. The interposer substrate may be electrically connected to the conductive structure. A height of the passive element may be greater than a height of the semiconductor chip.

16 Claims, 34 Drawing Sheets

(56) References Cited

U.S. PATENT DOCUMENTS

| | | |
|---|---|---|
| 8,604,615 B2 | 12/2013 | Lee et al. |
| 8,952,517 B2 | 2/2015 | Kwon et al. |
| 9,230,898 B2 | 1/2016 | Shin et al. |
| 9,370,103 B2 | 6/2016 | Yun et al. |
| 9,553,041 B1 | 1/2017 | Kelly et al. |
| 9,627,329 B1 | 4/2017 | Kwon et al. |
| 9,811,122 B2 | 11/2017 | Kwon |
| 2010/0213592 A1 | 8/2010 | Ishii et al. |
| 2011/0140283 A1* | 6/2011 | Chandra ............. H01L 25/0652 |
| 2011/0248389 A1* | 10/2011 | Yorita ................ H01L 25/0652 |
| | | 257/659 |
| 2012/0136596 A1 | 5/2012 | Yamaoka et al. |
| 2013/0105939 A1* | 5/2013 | Domae ............... H01L 25/0652 |
| | | 257/528 |
| 2014/0126168 A1 | 5/2014 | Fujita et al. |
| 2014/0361387 A1* | 12/2014 | Meyer ................ B81C 1/00333 |
| | | 257/415 |
| 2015/0130041 A1 | 5/2015 | Seo et al. |
| 2016/0276307 A1* | 9/2016 | Lin ....................... H01L 23/552 |
| 2017/0068633 A1 | 3/2017 | Kwon |
| 2017/0133353 A1* | 5/2017 | Lin ....................... H05K 1/183 |
| 2017/0185107 A1 | 6/2017 | Kwon |
| 2017/0186679 A1 | 6/2017 | Kelly et al. |

* cited by examiner

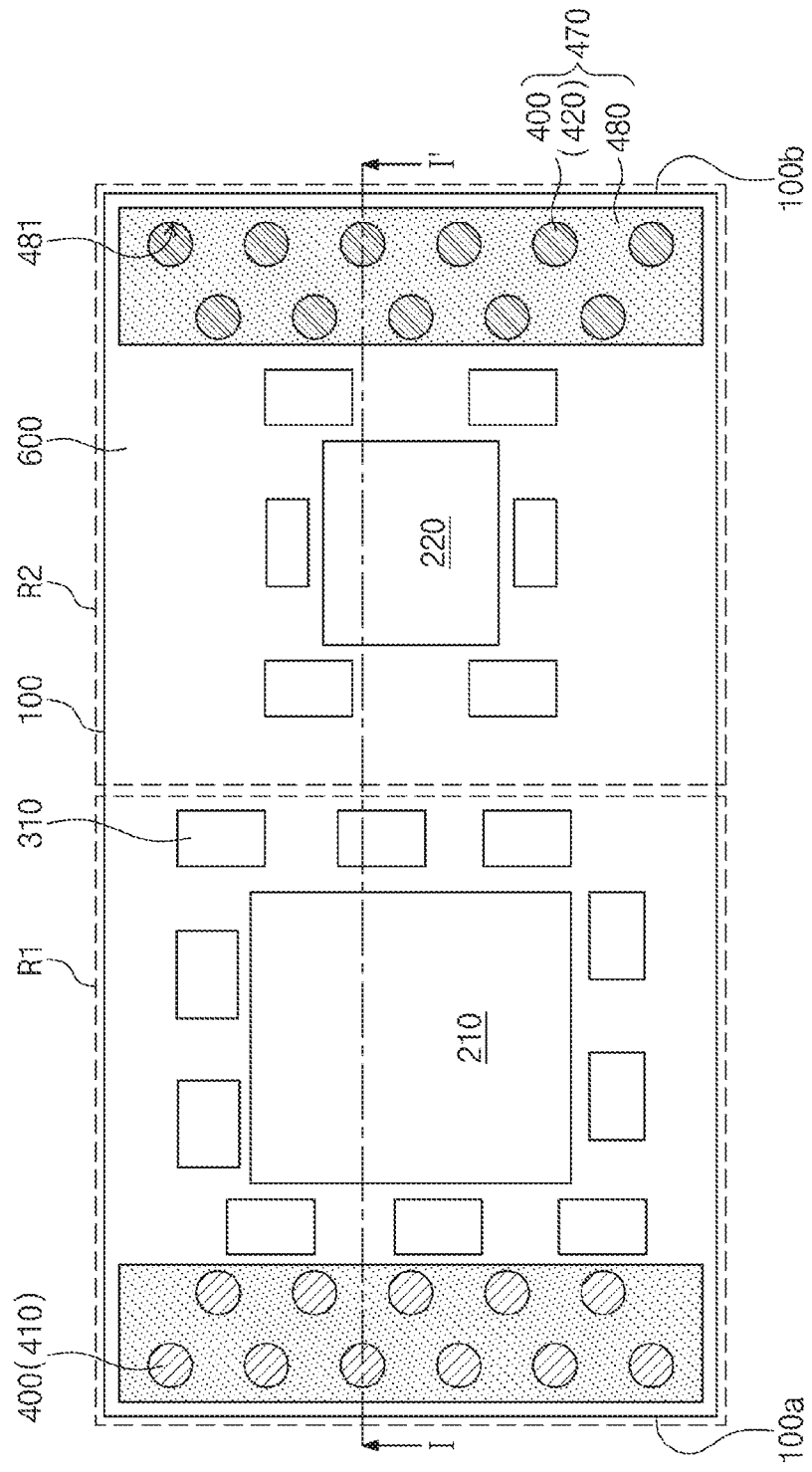

SEMICONDUCTOR PACKAGE

CROSS-REFERENCE TO RELATED APPLICATIONS

This U.S. non-provisional patent application claims priority under 35 U.S.C. § 119 of Korean Patent Application Nos. 10-2018-0055446 (filed on May 15, 2018), 10-2018-0057769 (filed on May 21, 2018), 10-2018-0058343 (filed on May 23, 2018), and 10-2018-0117775 (filed on Oct. 2, 2018), the entire contents of which are hereby incorporated by reference.

BACKGROUND

The present disclosure herein relates to a semiconductor package, and more particularly to a stacked semiconductor package including an interposer substrate.

The semiconductor package may be implemented in a form suitable for use in an electronic product. Generally, semiconductor packages are mounted with a semiconductor chip on a printed circuit board and electrically connected to each other using bonding wires or bumps. Due to the development of the electronic industry, various studies are in progress to improve the reliability and durability of a semiconductor package. High speed, high capacity, and miniaturization of semiconductor packages have become more important.

SUMMARY

The present disclosure provides a semiconductor package with improved electrical characteristics.

An embodiment of inventive concepts provides a semiconductor package including: a substrate; a semiconductor chip on the substrate; a passive element on the substrate, a height of the passive element being greater than a height of the semiconductor chip; a conductive structure on the substrate; and an interposer substrate on the semiconductor chip, the passive element, and the conductive structure. The interposer substrate may be electrically connected to the conductive structure.

In an embodiment of inventive concepts, a semiconductor package includes: a substrate; a semiconductor chip on an upper surface of the substrate; a passive element on the upper surface of the substrate; an interposer substrate on the semiconductor chip and the passive element; a conductive structure between the substrate and the interposer substrate; a lower solder connection portion between the substrate and the conductive structure; and an upper solder connection portion between the conductive structure and the interposer substrate.

In an embodiment of inventive concepts, a semiconductor package includes: a substrate; a semiconductor chip on an upper surface of the substrate; a passive element on the upper surface of the substrate; a conductive structure on the substrate; an interposer substrate on the semiconductor chip, the passive element, and the conductive structure, the interposer substrate being electrically connected to the conductive structure; and a lower solder connection portion between the substrate and the conductive structure and the lower solder connection portion being connected to the substrate and the conductive structure. An upper surface of the passive element may be disposed at a higher level than an upper surface of the semiconductor chip.

BRIEF DESCRIPTION OF THE FIGURES

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings:

FIG. 9A is a plan view of a lower semiconductor package according to embodiments;

DETAILED DESCRIPTION

Figure 1A:
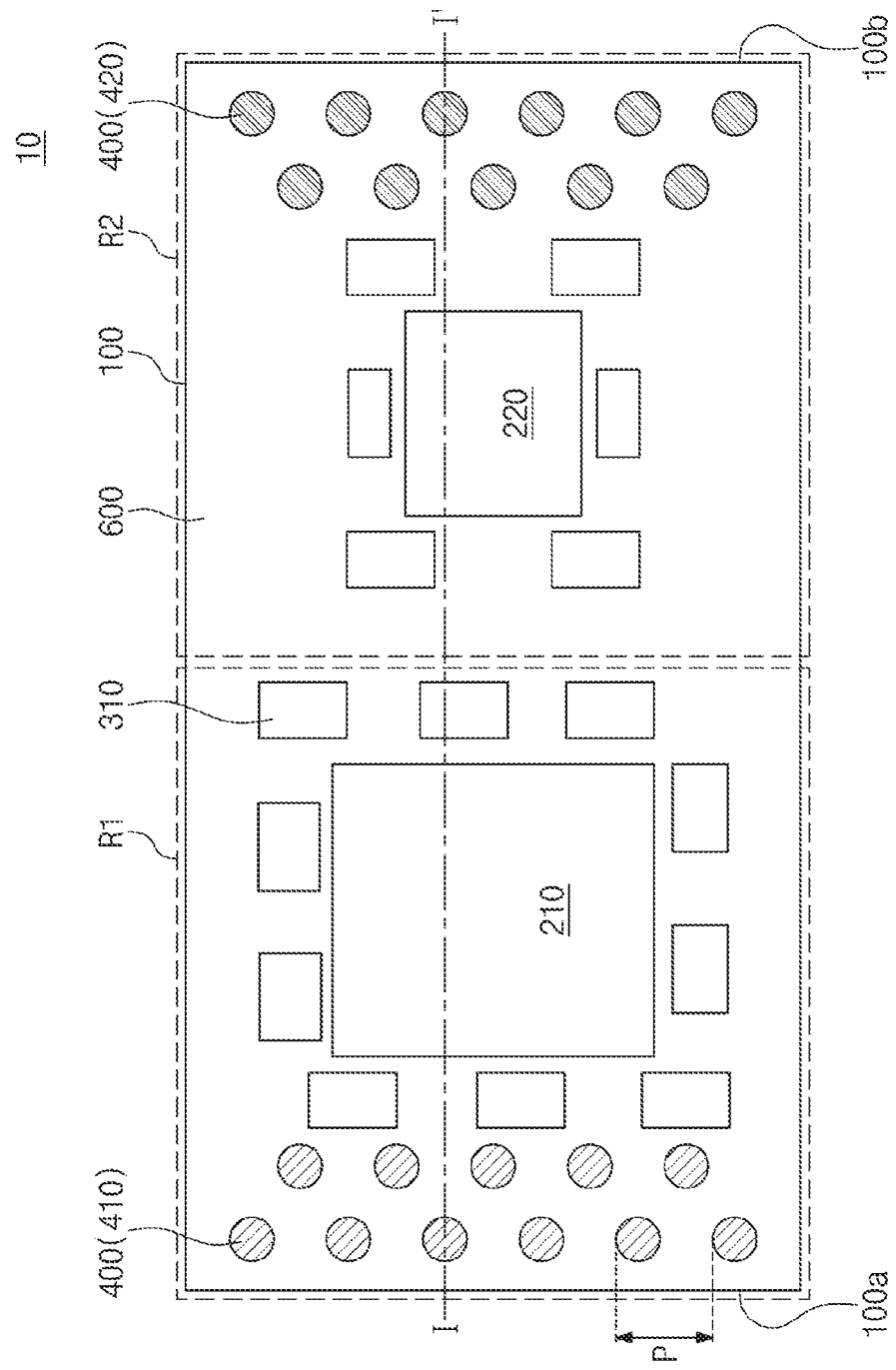
FIG. 1A is a plan view of a lower semiconductor package according to embodiments.

In this specification, like reference numerals refer to like components throughout the specification. Hereinafter, a semiconductor package, a method of manufacturing a semiconductor package, and a semiconductor module according to the concept of inventive concepts will be described. Throughout the specification, when a component is described to be on another component, the component is not necessarily physically contact the other component.

Figure 1B:
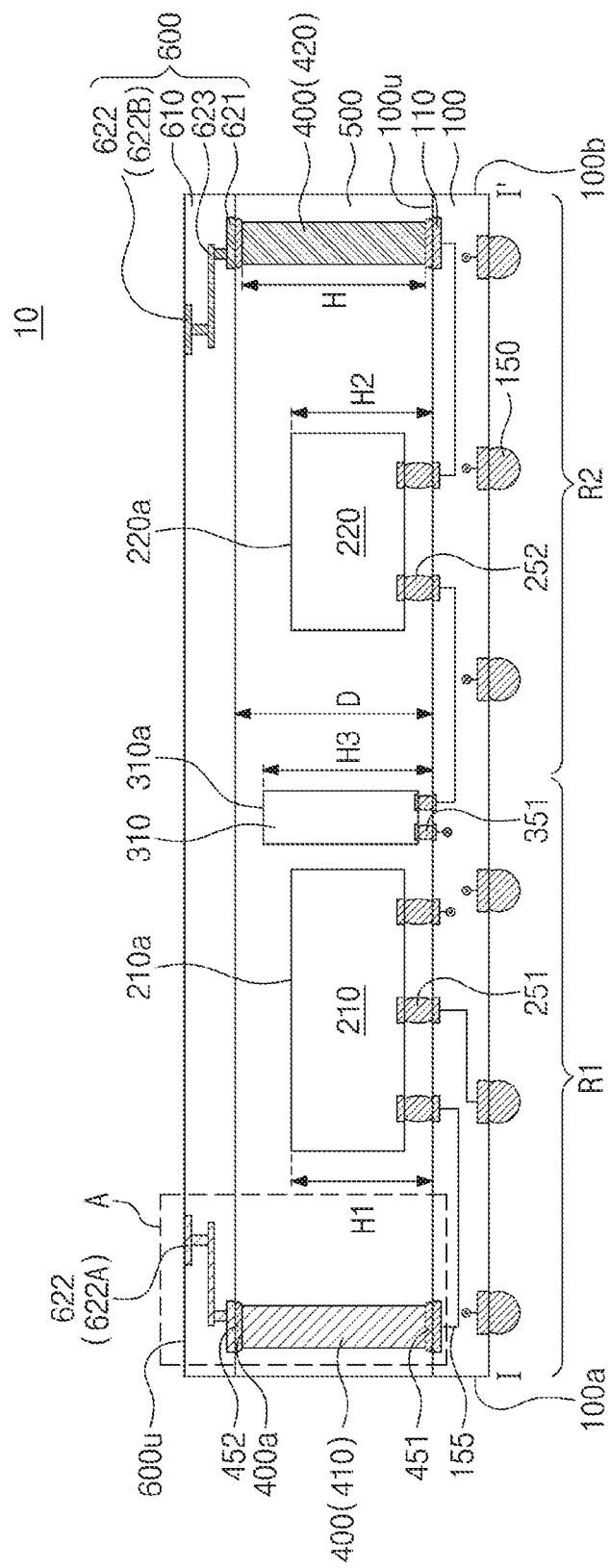
FIG. 1B is a cross-sectional view taken along the line I-I' of FIG. 1A.
Figure 1C:
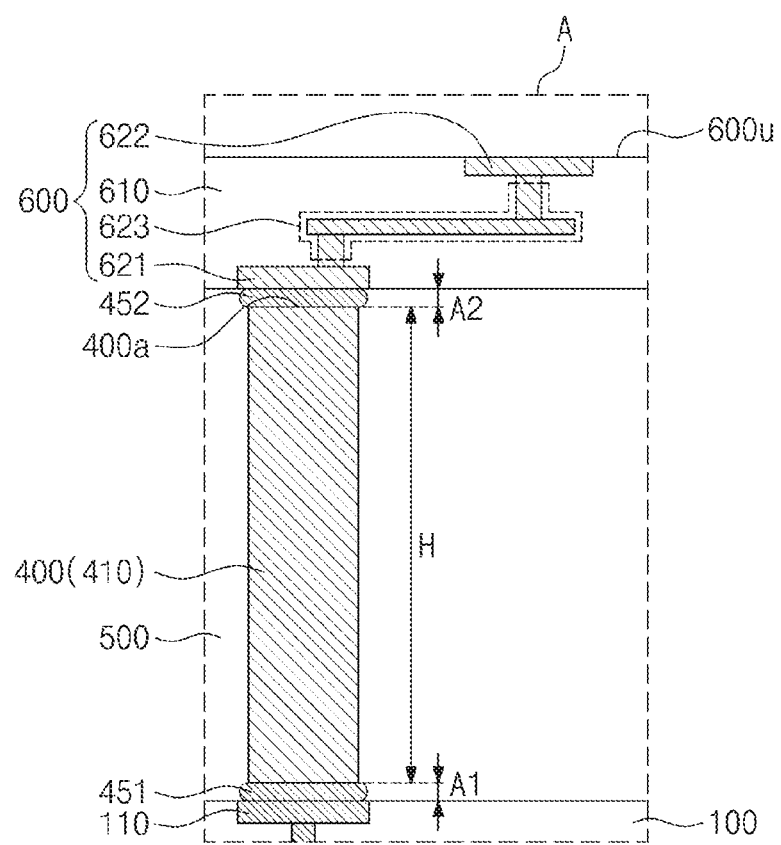
FIG. 1C is an enlarged view of the region A of FIG. 1B.

FIG. 1A is a plan view of a lower semiconductor package according to embodiments. FIG. 1B is a cross-sectional view taken along the line I-I' of FIG. 1A. FIG. 1C is an enlarged view of the area A of FIG. 1B. Referring to FIGS. 1A, 1B and 1C, a lower semiconductor package 10 includes a lower substrate 100, semiconductor chips 210 and 220, a passive element 310, a conductive structure 400, and an interposer substrate 600. The lower substrate 100 may have a first side 100a and a second side 100b opposite to each other. The lower substrate 100 may have a first region R1 and a second region R2 in plan view. The first region R1 of the lower substrate 100 may be closer to the first side 100a than the second region R2. As an example, a printed circuit board (PCB) having a circuit pattern may be used as the lower substrate 100. The lower substrate 100 may include a substrate pad 110 and a wiring 155. The substrate pads 110 may be exposed on the upper surface 100u of the lower substrate 100. The wiring 155 may be provided in the lower substrate 100 and may be connected to the substrate pads 110. A solid line in the lower substrate 100 schematically shows the wiring 155 in the lower substrate 100. External terminals 150 may be provided on the lower surface of the lower substrate 100. The external terminals 150 may include at least one of solder balls, bumps, and pillars. The external terminals 150 may include, for example, a metal. The external terminals 150 may be connected to the substrate pads 110 through the wiring 155.

The semiconductor chips 210 and 220 may be mounted on the upper surface 100u of the lower substrate 100. The semiconductor chips 210 and 220 may include a first semiconductor chip 210 and a second semiconductor chip 220. The first semiconductor chip 210 may be provided on the upper surface 100u of the first region R1 of the lower substrate 100. The first semiconductor chip 210 may include integrated circuits having different functions therein. The first semiconductor chip 210 may include logic circuits and memory circuits. The first semiconductor chip 210 may include a logic chip for computing and processing data. For example, the first semiconductor chip 210 may be any one of a system on chip (SOC), a modem chip, a ModAP chip, an application processor (AP) chip, and a communication processor (CP) chip. A first connection portion 251 may be interposed between the substrate pad 110 and the first semiconductor chip 210. The first semiconductor chip 210 may be electrically connected to the lower substrate 100 through the first connection portion 251. In this specification, the electrical connection with the substrate may mean that it is electrically connected to the wiring in the substrate. The fact that it is electrically connected to the semiconductor chip may mean that it is electrically connected to the integrated circuits of the semiconductor chip through the chip pad of the semiconductor chip. The first connection portion 251 may include a solder ball, a pillar, a bump, or a ball grid array. The height H1 of the mounted first semiconductor chip 210 may be defined to include the height of the first connection portion 251. In this specification, the height of any component may mean the maximum distance of the component measured in a direction perpendicular to the upper surface 100u of the lower substrate 100.

The second semiconductor chip 220 may be provided on the upper surface 100u of the second region R2 of the lower substrate 100. The second semiconductor chip 220 may be spaced apart from the first semiconductor chip 210. The second semiconductor chip 220 may be a semiconductor chip different from the first semiconductor chip 210. The second semiconductor chip 220 functions differently from the first semiconductor chip 210 and may have different sizes. For example, the second semiconductor chip 220 may include a power management integrated circuit (PMIC) therein to function as a power management chip. A second connection portion 252 may be interposed between the lower substrate 100 and the second semiconductor chip 220. The second connection portion 252 may include a solder ball, a pillar, a bump, or a ball grid array. The second semiconductor chip 220 may be electrically connected to the lower substrate 100 through the second connection portion 252. The height H2 of the mounted second semiconductor chip 220 may be defined to include the height of the second connection portion 252.

A passive element 310 may be mounted on the upper surface 100u of the lower substrate 100. The passive element 310 may be spaced apart from the first semiconductor chip 210 and the second semiconductor chip 220 in plan view. The passive element 310 may include any one of an inductor, a resistor, and a capacitor. A first connection terminal 351 may be provided between the lower substrate 100 and the passive element 310 to be connected to any one of the substrate pads 110. The first connection terminal 351 may include a solder or a bump. The first connection terminal 351 may include a conductive material such as a metal. The passive element 310 may be connected to the lower substrate 100 through the first connection terminal 351.

The passive elements 310 may include a plurality of passive elements 310 spaced from one another. The passive elements 310 may be same or different type passive elements. When the passive elements 310 include different type passive elements, one of the passive elements 310 may include an inductor and the other of the passive elements 310 may include a capacitor.

The height H3 of at least one of the mounted passive elements 310 may be greater than the height H1 of the mounted first semiconductor chip 210 and the height H2 of the second semiconductor chip 220. At this time, the height H3 of the mounted passive elements 310 may be defined as including the height of the first connection terminal 351. At least one of the upper surfaces 310a of the passive elements 310 is provided at a higher level than the upper surface 210a of the first semiconductor chip 210 and the upper surface 220a of the second semiconductor chip 220. The planar arrangement, shape, and number of the passive elements 310 are not limited to those shown and may be variously modified.

The interposer substrate 600 may be provided on the first semiconductor chip 210, the second semiconductor chip 220, the passive elements 310, and the conductive structure 400. The lower surface of the interposer substrate 600 may face the first semiconductor chip 210, the second semiconductor chip 220, and the passive elements 310. The interposer substrate 600 may include an insulating layer 610, a lower pad 621, a conductive pattern 623, and an upper pad 622. The insulating layer 610 may include a plurality of insulating layers 610 as shown in FIG. 1C. Although only a single insulating layer 610 is shown for simplification in the drawing except FIGS. 1C and 2B, inventive concepts are not limited thereto. The lower pad 621 may be exposed on the lower surface of the interposer substrate 600. The conductive pattern 623 may include a wiring portion and a via portion. A wiring portion may be provided between the insulating layers 610. The via portion may penetrate at least one of the insulating layers 610. The upper pad 622 may be exposed on the upper surface 600u of the interposer substrate 600. The upper pad 622 may be connected to the lower pad 621 through the conductive pattern 623. Accordingly, the arrangement of the upper pads 622 may be provided more freely. For example, the upper pad 622 may not be vertically aligned with the lower pad 621, the conductive structure 400, and the substrate pad 110 that are electrically connected. The vertical direction may be a direction perpendicular to the upper surface 100u of the lower substrate 100. The upper pad 622 may serve as a terminal for connection to another package or element. In this specification, electrical connection to the interposer substrate 600 may mean that it is electrically connected to the upper pad 622 of the interposer substrate 600. The upper pad 622 may include a signal pad 622A and a power pad 622B that are electrically separated from each other as shown in FIG. 1B.

The conductive structure 400 may be interposed between the lower substrate 100 and the interposer substrate 600. A lower solder connection portion 451 may be provided between the lower substrate 100 and the lower surface of the conductive structure 400 to connect to the substrate pad 110 and the conductive structure 400. The conductive structure 400 may be electrically connected to the lower substrate 100 through the lower solder connection portion 451. The lower solder connection portion 451 may include solder material. The solder material may include tin, silver, and/or bismuth. The lower solder connection portion 451 may include a different material than that of the conductive structure 400. For example, the conductive structure 400 may include at least one selected from metals, for example, copper, aluminum, gold, lead, stainless steel, iron, and alloys thereof. The conductive structure 400 may have a higher melting point than that of the lower solder connection portion 451. The height H of the conductive structure 400 may be greater than the thickness of the lower solder connection portion 451.

An upper solder connection portion 452 may be interposed between the upper surface 400a of the conductive structure 400 and the interposer substrate 600 to be connected to the conductive structure 400 and the lower pad 621. The interposer substrate 600 may be electrically connected to the lower substrate 100 through the conductive structure 400. The upper solder connection portion 452 may include solder material. The conductive structure 400 may include a different material than that of the upper solder connection portion 452. The conductive structure 400 may have a higher melting point than that of the upper solder connection portion 452. The height H of the conductive structure 400 may be greater than the thickness of the upper solder connection portion 452.

When the interposer substrate 600 and the lower substrate 100 are connected by a single solder ball or directly bonded solder balls, the solder balls or bonded solder balls may have a relatively low height. In this case, the gap between the lower substrate 100 and the interposer substrate 600 is small such that the passive element 310 may be difficult to be provided on the upper surface 100u of the lower substrate 100. For example, the passive element 310 may be provided outside the lower semiconductor package 10. In this case, the length of the electrical path connected to the passive element 310 may be increased. When the solder balls or bonded solder balls are formed to have a large height, the diameter and pitch of the solder balls or bonded solder balls may increase.

According to embodiments, each of the conductive structures 400 may be a pin or a metal column. The conductive structure 400 may have a columnar shape such as a cylindrical or polygonal column. The conductive structure 400 may have a relatively uniform and small diameter. The diameter at the lower part of each conductive structure 400 may be substantially the same as the diameter at the upper part of the conductive structure 400 and the diameter at the middle part of the conductive structure 400. The pitch P of the conductive structures 400 may be small. The pitch P of the conductive structures 400 may be about 0.01 mm to about 0.5 mm. Thus, the lower semiconductor package 10 may be miniaturized.

Since a pin or a metal column is used as the conductive structures 400, each of the conductive structures 400 may have a relatively large height H. For example, the height H of the conductive structure 400 may be equal to or greater than the height H3 of the mounted passive elements 310. The height H of the conductive structure 400 may be greater than the height H1 of the mounted first semiconductor chip 210 and the height H2 of the mounted second semiconductor chip 220. At this time, the height H of the conductive structure 400 may be defined as the distance between the upper surface 400a and the lower surface of the conductive structure 400. The upper surface 400a of the conductive structure 400 may be provided at the same or higher level than the upper surfaces 310a of the passive elements 310. The upper surface 400a of the conductive structure 400 may be provided at a higher level than the upper surface 210a of the first semiconductor chip 210 and the upper surface 220a of the second semiconductor chip 220. Accordingly, the gap D between the lower substrate 100 and the interposer substrate 600 may be increased. The gap D between the lower substrate 100 and the interposer substrate 600 may be sufficiently large that the passive elements 310 are provided between the lower substrate 100 and the interposer substrate 600. The passive elements 310 may be electrically connected to at least one of the first semiconductor chip 210 and the second semiconductor chip 220 through the lower substrate 100. The passive elements 310 may be electrically connected to the interposer substrate 600 through the lower substrate 100 and the conductive structures 400. As the passive element 310 is provided on the upper surface 100u of the lower substrate 100, the length of the electrical path between the passive element 310 and the first semiconductor chip 210, the passive element 310 and the second semiconductor chip 220, and the passive element 310 and the interposer substrate 600 may be reduced. The electrical characteristics of the lower semiconductor package 10 may be improved. Hereinafter, the electrical connection and conductive structures 400 of the lower semiconductor package 10 will be described in more detail.

The conductive structure 400 may include first conductive structures 410 and second conductive structures 420. The first conductive structures 410 may be provided on the first region R1 of the lower substrate 100. The first conductive structures 410 may be disposed closer to the first semiconductor chip 210 than the second conductive structures 420. The first conductive structures 410 may be provided adjacent to the first side 100a of the lower substrate 100. The first conductive structures 410 may be disposed closer to the first semiconductor chip 210 than the second conductive structures 420. The first conductive structures 410 may be provided adjacent to the first side 100a of the lower substrate 100. The first conductive structures 410 may be arranged in columns in parallel with the first direction in plan view, and the first direction may be parallel to the first side 100a of the lower substrate 100. The planar arrangement and array of the first conductive structures 410 may be variously modified. For example, the number of columns of the first conductive structures 410 may be varied.

The first conductive structures 410 may include signal structures. The signal structure may perform the function of transferring an electrical signal such as a data signal between any two components. For example, at least a portion of the first conductive structures 410 may function as signal paths between the first semiconductor chip 210 and the interposer substrate 600 in connection with the signal pad 622A. For example, the signal may be transmitted to the signal pad 622A from the first semiconductor chip 210 through the first conductive structures 410 and the lower substrate 100. Since the first conductive structures 410 are disposed adjacent to the first semiconductor chip 210, the length of the signal path between the first semiconductor chip 210 and the signal pad 622A may be reduced.

In one example, the first conductive structure 410 further includes a power supply structure, and the total number of signal structures in the first conductive structures 410 may be greater than the number of power supply structures in the first conductive structures 410. In another example, the first conductive structure 410 includes a signal structure, but may not include a power supply structure. For another example, the first conductive structure 410 may further include a ground structure. The ground structure may serve to deliver a ground voltage between the two components.

The second conductive structures 420 may be provided on the second region R2 of the lower substrate 100. The second conductive structures 420 may be disposed closer to the second semiconductor chip 220 than the first conductive structures 410. The second conductive structures 420 may have the same shape and may include the same material as the first conductive structures 410. However, the arrangement, electrical connection, and function of the second conductive structures 420 may be different from the first conductive structures 410. For example, the second conductive structures 420 may function as power supply structures. A power supply structure may supply or transmit power from one component to another. The second conductive structures 420 may be electrically connected to the power supply pads 622B to function as a power path between the second semiconductor chip 220 and the interposer substrate 600. The power path may mean a power supply path. For example, the power outputted from the second semiconductor chip 220 may be transmitted to the power supply pad 622B through the lower substrate 100 and the second conductive structures 420. The second semiconductor chip 220 functions as a power management semiconductor chip and the second conductive structures 420 include power supply structures, such that the length of the power path between the second semiconductor chip 220 and the upper pad 622 may be reduced. Thus, the power integrity (PI) of the lower semiconductor package 10 may be improved. The second conductive structures 420 may be insulated from the first conductive structures 410.

In one example, the second conductive structures 420 include a power supply structure, but may not include a signal structure. As another example, the second conductive structure 420 may further include a signal structure. In this case, the total number of power supply structures in the second conductive structures 420 may be greater than the number of signal structures in the second conductive structures 420.

The second conductive structures 420 may be provided adjacent to the second side 100b of the lower substrate 100. The second conductive structures 420 may be arranged in columns in parallel with the second side 100b in plan view. The planar arrangement and array of the second conductive structures 420 may be variously modified. For example, the number of columns of the second conductive structures 420 may be varied.

The upper pad 622 may be electrically connected to any one of the first semiconductor chip 210, the second semiconductor chip 220, and the passive elements 310 through the conductive structures 400 and the lower substrate 100.

The lower molding film 500 may fill the gap between the lower substrate 100 and the interposer substrate 600. The lower molding film 500 is provided on the upper surface 100u of the lower substrate 100 to seal the first semiconductor chip 210, the second semiconductor chip 220, and the passive elements 310. The lower molding film 500 may cover the upper surface 210a of the first semiconductor chip 210, the upper surface 220a of the second semiconductor chip 220, the upper surfaces 310a of the passive elements 310, the sidewalls of the conductive structure 400, and the lower surface of the interposer substrate 600. The lower molding film 500 may further seal at least one of the first connection portion 251 and the second connection portion 252. For example, the lower molding film 500 may further seal at least one of a side wall of the first connection portion 251 and a side wall of the second connection portion 252. The lower molding film 500 may include an insulating polymer such as an epoxy based molding compound (EMC). As another example, an underfill material may be further provided on at least one of a gap between the lower substrate 100 and the first semiconductor chip 210, a gap between the lower substrate 100 and the second semiconductor chip 220, and a gap between the lower substrate 100 and the third semiconductor chip 720 (see underfill film 800 in FIG. 10C).

Although not shown in the drawing, an electronic element may be further provided on the upper surface 100u of the lower substrate 100. The electronic element may include an oscillator such as a crystal oscillator or a real-time clock.

Figure 2A:
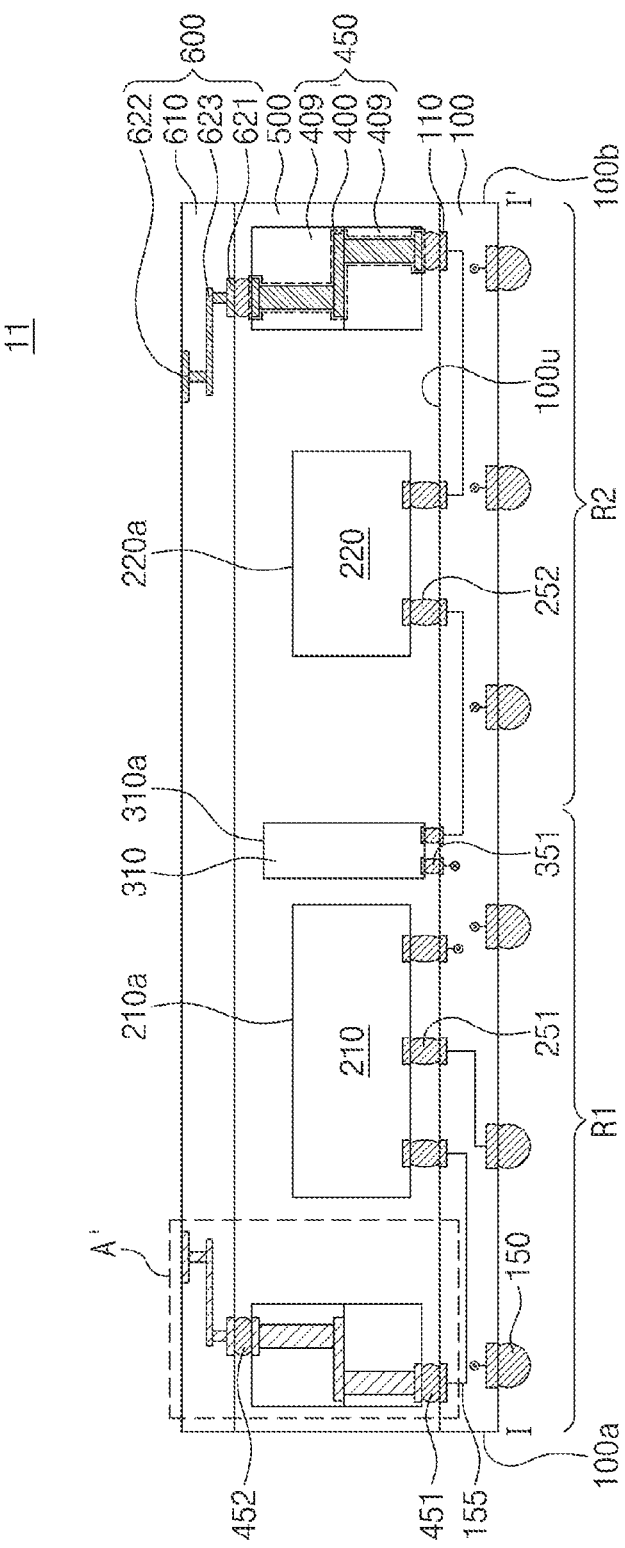
FIG. 2A is a plan view for explaining a lower semiconductor package according to embodiments.
Figure 2B:
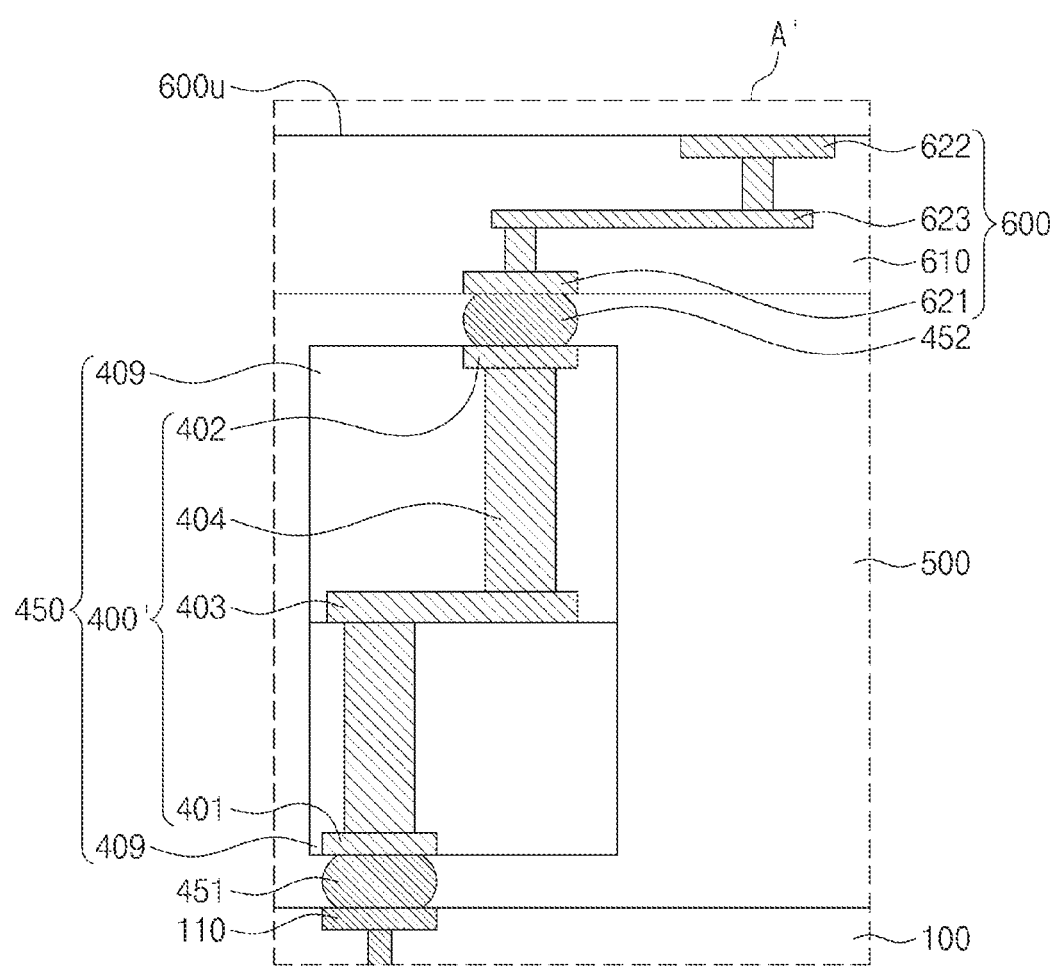
FIG. 2B corresponds to an enlarged view of the region A' in FIG. 2A.

FIG. 2A is a plan view for explaining a lower semiconductor package according to embodiments. FIG. 2B corresponds to an enlarged view of the region A' in FIG. 2A.

Referring to FIGS. 2A and 2B, the lower semiconductor package 11 may include a connection structure 450 in addition to the lower substrate 100, the first semiconductor chip 210, the second semiconductor chip 220, and the lower molding film 500. The connection structure 450 may be provided between the lower substrate 100 and the interposer substrate 600. The connection structure 450 may include a base layer 409 and a conductive structure 400'. The base layer 409 may include stacked base layers 409. The base layers 409 may include an insulating material. For example, the base layers 409 may include an insulating polymer or a silicon containing insulating material.

A conductive structure 400' may be provided in the base layers 409. By providing the connection structure 450, a conductive structure 400' may be provided between the interposer substrate 600 and the lower substrate 100. The conductive structure 400' may include a first conductive pad 401, a conductive wiring 403, conductive vias 404, and a second conductive pad 402 as shown in FIG. 2B. The first conductive pad 401 may be provided on the lower surface of the connection structure 450. A conductive wiring 403 may be interposed between the base layers 409. The conductive vias 404 penetrate the base layers 409 and may be connected to the conductive wiring 403. The second conductive pad 402 is disposed on the upper surface of the connection structure 450 and may be connected to any one of the conductive vias 404. The second conductive pad 402 may be electrically connected to the first conductive pad 401 through the conductive vias 404 and the conductive wiring 403. The second conductive pads 402 may not be vertically aligned with the first conductive pads 401. The conductive structure 400' may include a metal such as copper.

A lower solder connection portion 451 may be provided between the lower substrate 100 and the conductive structure 400' to connect to the first conductive pads 401 and at least one of the substrate pads 110. The upper solder connection portion 452 is interposed between the conductive structure 400' and the interposer substrate 600 to be connected to the second conductive pad 402 and the lower pad 621. The conductive structure 400' may have a higher melting point than that of the lower solder connection portion 451 and the upper solder connection portion 452.

According to the embodiments, as the connection structure 450 is provided, the upper solder connection portion 452 may be more freely deployed and designed. For example, the upper solder connection portion 452 may not be vertically aligned with the lower solder connection portion 451. Accordingly, the degree of freedom of arrangement of the upper pad 622 may be further increased.

Figure 3:
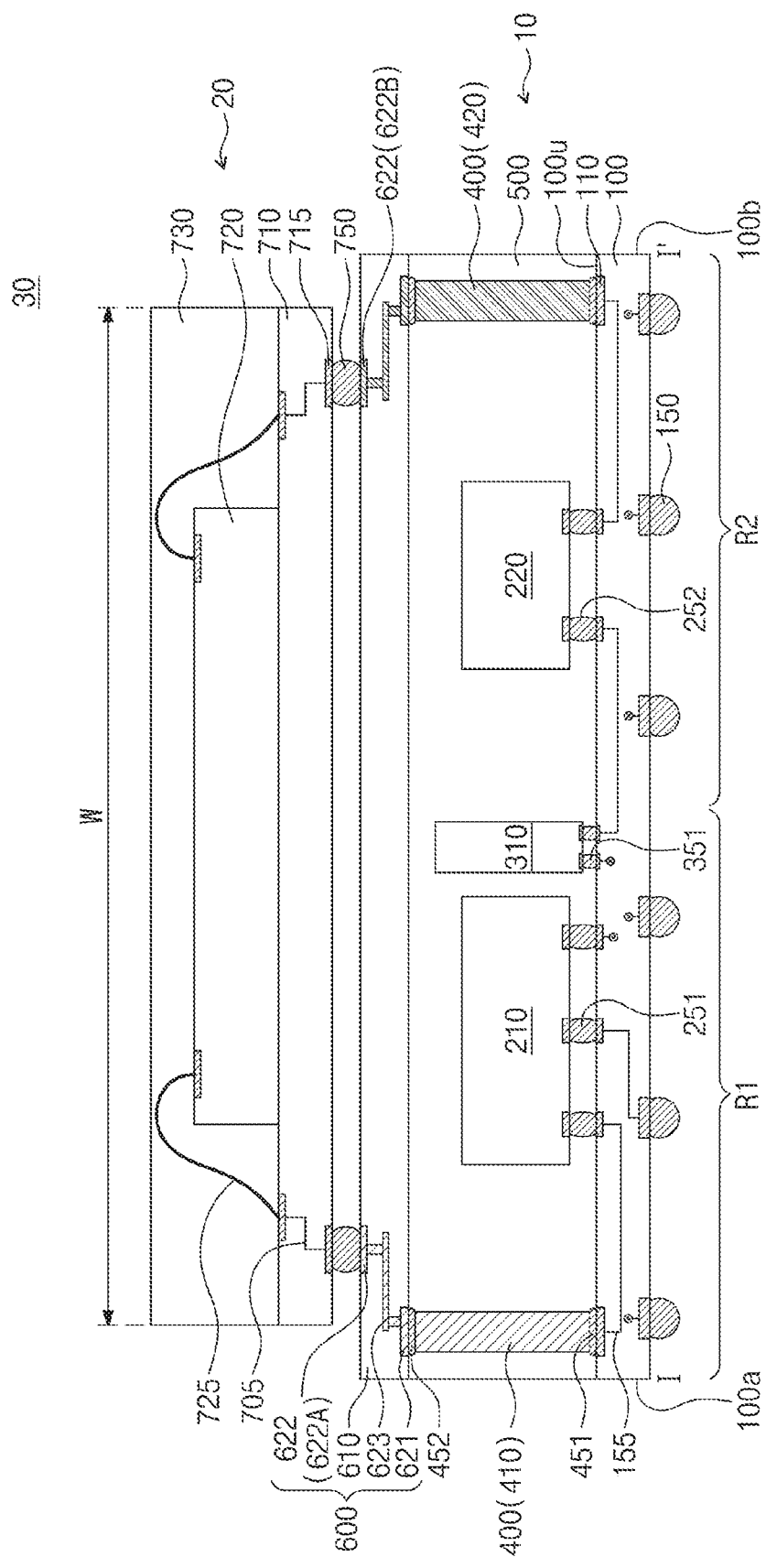
FIG. 3 is a view for explaining a semiconductor package according to embodiments.

FIG. 3 is a view for explaining a semiconductor package according to embodiments, and corresponds to a section taken along the line I-I' of FIG. 1A.

Referring to FIG. 3, the semiconductor package 30 may include a lower semiconductor package 10 and an upper semiconductor package 20. At this time, the lower semiconductor package 10 described with reference to FIGS. 1A to 1C may be used. Unlike what is shown, the lower semiconductor package 11 described with reference to FIGS. 2A and 2B may be used.

The upper semiconductor package 20 may be provided on the lower semiconductor package 10. The upper semiconductor package 20 may include, for example, an upper substrate 710, a third semiconductor chip 720, and an upper molding film 730. A printed circuit board or a rewiring layer may be used as the upper substrate 710. A metal pad 715 may be provided on the lower surface of the upper substrate 710. The third semiconductor chip 720 may be mounted on the upper surface of the upper substrate 710. The third semiconductor chip 720 may be a semiconductor chip different from the first semiconductor chip 210 and the second semiconductor chip 220. For example, the third semiconductor chip 720 may function as a memory chip, and may store data in integrated circuits. The integrated circuits of the third semiconductor chip 720 may include memory circuits. The memory chip may include a DRAM chip, an SRAM chip, an MRAM chip, and/or a NAND flash memory chip. The third semiconductor chip 720 may be connected to the upper substrate 710 through a third connection portion 725. The third connection portion 725 includes a bonding wire and may be provided on the third semiconductor chip 720. The third connection portion 725 may include a metal such as gold (Au). As another example, a third connection portion 725 is provided between the upper substrate 710 and the second semiconductor chip 220 and may include a solder, a bump, a ball grid array, or a pillar. The third semiconductor chip 720 may be electrically connected to the metal pad 715 through the third connection portion 725 and the internal wiring 705 in the upper substrate 710. A solid line in the upper substrate 710 schematically shows the internal wiring 705. Unlike what is shown in the drawing, the third semiconductor chip 720 may be provided in plurality on the upper substrate 710. An upper molding film 730 may be provided on the upper substrate 710 to cover the third semiconductor chip 720. The upper molding film 730 may include an epoxy-based molding compound.

A conductive terminal 750 may be interposed between the interposer substrate 600 and the upper semiconductor package 20. The conductive terminal 750 is provided on the upper pad 622 and may be connected to the metal pads 715. The metal pad 715 may be connected to the upper pad 622 through the conductive terminal 750. The conductive terminals 750 may include solders or bumps. The conductive terminal 750 may be formed by a reflow process. The conductive terminal 750 may include a metal. According to the embodiments, since the interposer substrate 600 is provided, the free arrangement degree of the conductive terminals 750 may be provided. For example, the conductive terminals 750 may not be vertically aligned with the corresponding ones of the conductive structures 400.

The third semiconductor chip 720 may receive signals of the first semiconductor chip 210 through the conductive terminals 750, the upper pad 622, and the first conductive structures 410. The upper semiconductor package 20 may receive power outputted from the second semiconductor chip 220 through the conductive terminals 750, the upper pad 622, and the second conductive structures 420. In this specification, the electrical connection with the upper semiconductor package 20 may mean that it is electrically connected to the third semiconductor chip 720.

The width W of the upper semiconductor package 20 may be smaller than the width of the lower semiconductor package 10. For example, the width W of the upper semiconductor package 20 may be less than the width of the interposer substrate 600. Accordingly, at least a portion of the upper surface of the interposer substrate 600 may not overlap with the upper semiconductor package 20 in plan view.

Figure 4A:
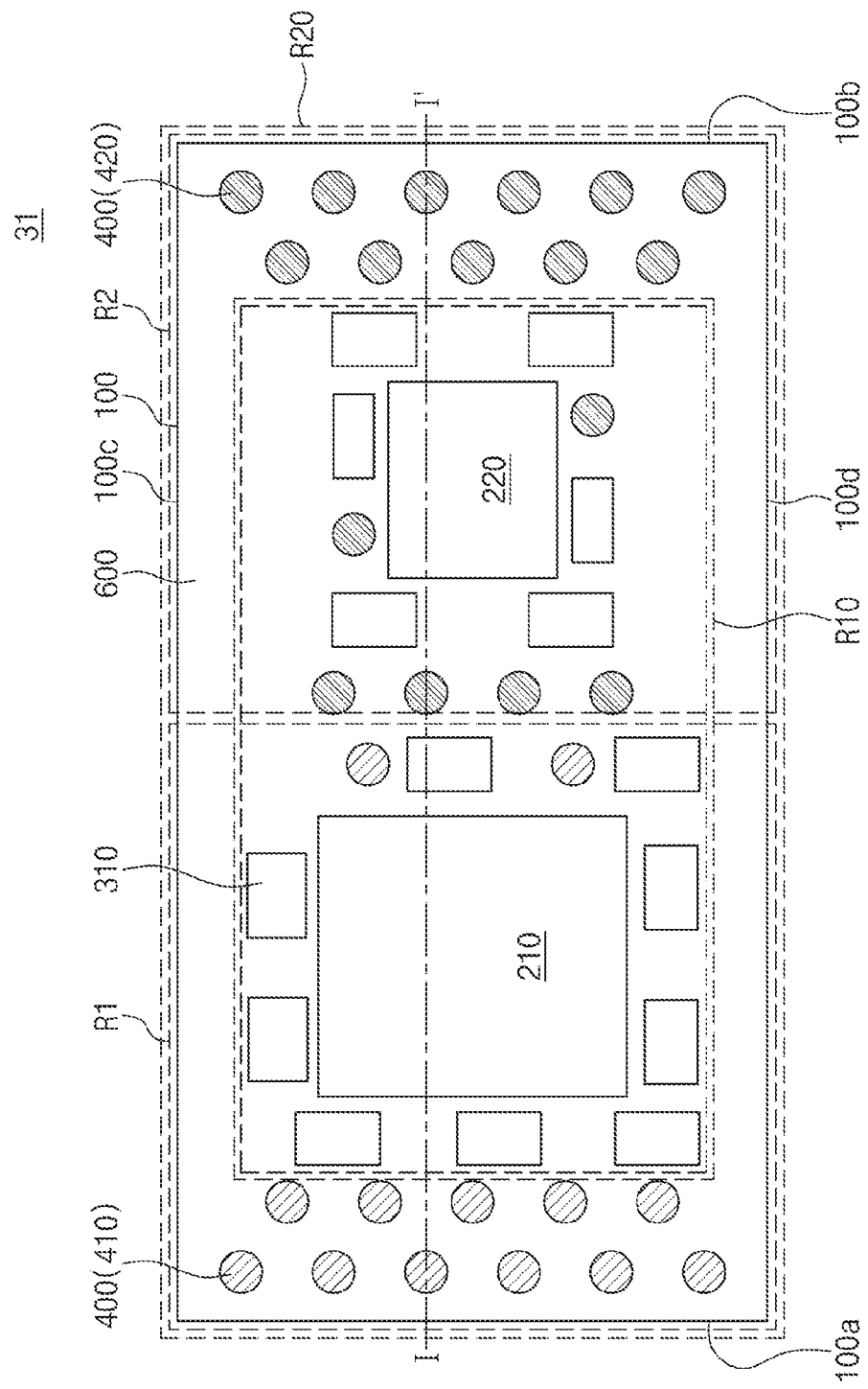
FIG. 4A is a plan view of a semiconductor package according to embodiments.
Figure 4B:
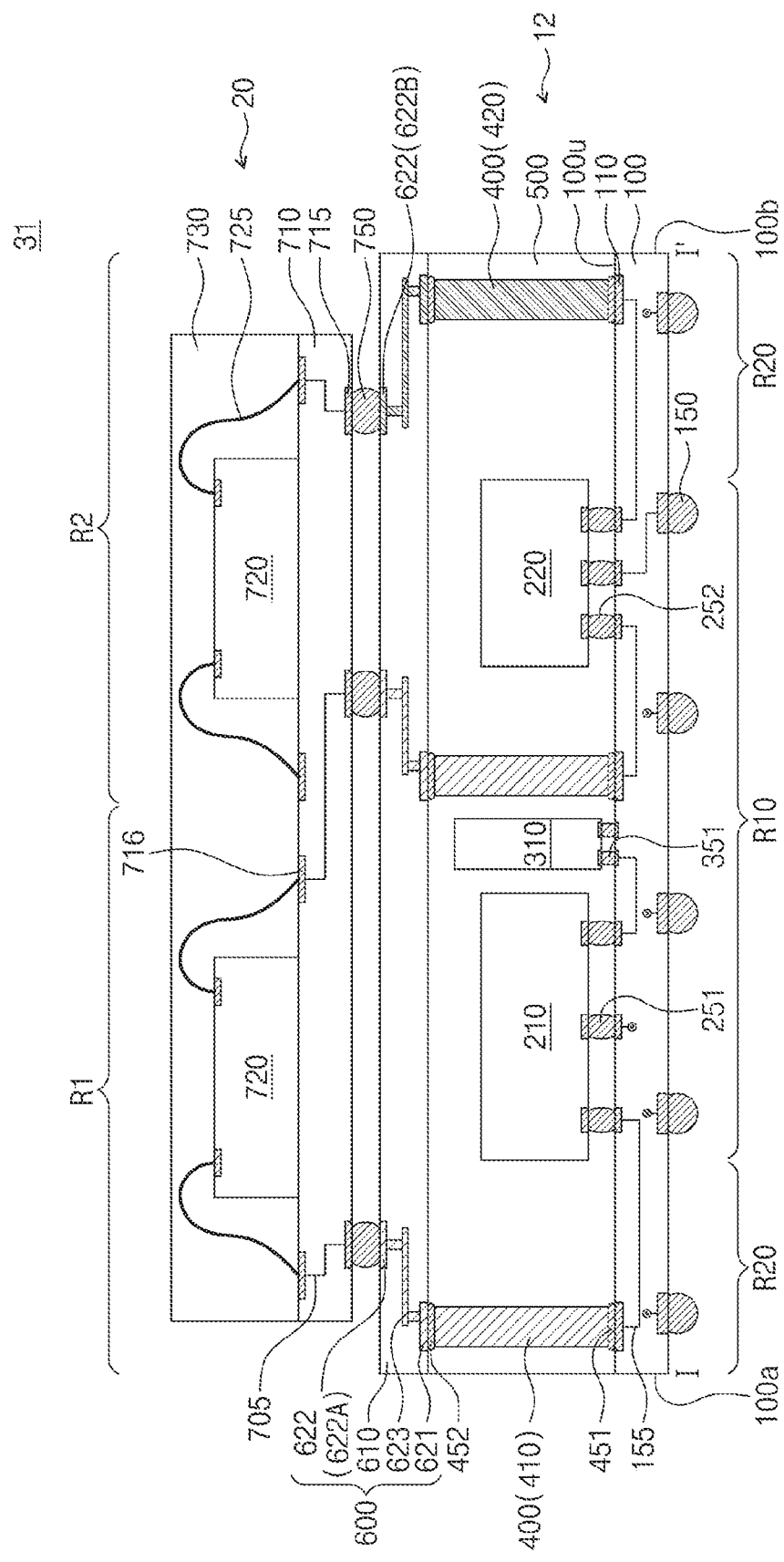
FIG. 4B is a cross-sectional view taken along the line I-I' of FIG. 4A.

FIG. 4A is a plan view of a semiconductor package according to embodiments. FIG. 4B is a cross-sectional view taken along the line I-I' of FIG. 4A.

Referring to FIGS. 4A and 4B, the semiconductor package 31 may include a lower semiconductor package 12 and an upper semiconductor package 20. The lower substrate 100 may have a center region R10 and an edge region R20 in plan view. As shown in FIG. 4A, the edge region R20 of the lower substrate 100 may be adjacent to the first side 100a, the second side 100b, the third side 100c, and the fourth side 100d of the lower substrate 100. The third side 100c may be adjacent to the first side 100a. The fourth side 100d may be opposite to the third side 100c. In plan view, the center region R10 of the lower substrate 100 may be surrounded by an edge region R20.

The conductive structures 400 may be provided on the edge region R20 of the lower substrate 100. For example, the first conductive structures 410 and the second conductive structures 420 may be provided on the edge region R20 of the lower substrate 100. The arrangement and electrical connection of the first conductive structures 410 and the second conductive structures 420 on the edge region R20 of the lower substrate 100 may be similar to that described with reference to FIGS. 1A and 1B.

The center region R10 of the lower substrate 100 may be configured to be provided with the first semiconductor chip 210, the second semiconductor chip 220, and the passive elements 310. At least one of the conductive structures 400 may be provided on the center region R10 of the lower substrate 100. For example, the conductive structures 400 may be disposed between the first semiconductor chip 210 and the second semiconductor chip 220, between the first semiconductor chip 210 and the passive elements 310, between the second semiconductor chip 220 and the passive elements 310, or between the passive elements 310. The first conductive structures 410 and the second conductive structures 420 may be provided on the center region R10 of the lower substrate 100. As another example, any one of the first conductive structure 410 and the second conductive structure 420 may not be provided in the center region R10.

The upper semiconductor package 20 may include an upper substrate 710, a third semiconductor chip 720, and an upper molding film 730 as described with reference to FIG. 3. However, the third semiconductor chips 720 may be provided in plurality. The third semiconductor chip 720 may be connected to the upper metal pads 716 through a third connection portion 725. The upper metal pads 716 may be provided on the upper surface of the upper substrate 710 to connect to the internal wiring 705 of the upper substrate 710. At least some of the upper metal pads 716 may overlap in plan view with the center region R10 of the lower substrate 100. The third semiconductor chips 720 may be electrically connected to the lower substrate 100 through the conductive structures 400 on the center region R10. Since the conductive structures 400 are provided on the center region R10, the length of the electrical path between the third semiconductor chip 720 and the lower substrate 100 may be further reduced. In addition, the internal wiring 705 of the upper substrate 710 may be designed more freely.

The lower substrate 100, the first semiconductor chip 210, the second semiconductor chip 220, the passive elements 310, the interposer substrate 600, and the lower molding film 500 may be substantially the same as those described with reference to FIGS. 1A and 1B.

Figure 5A:
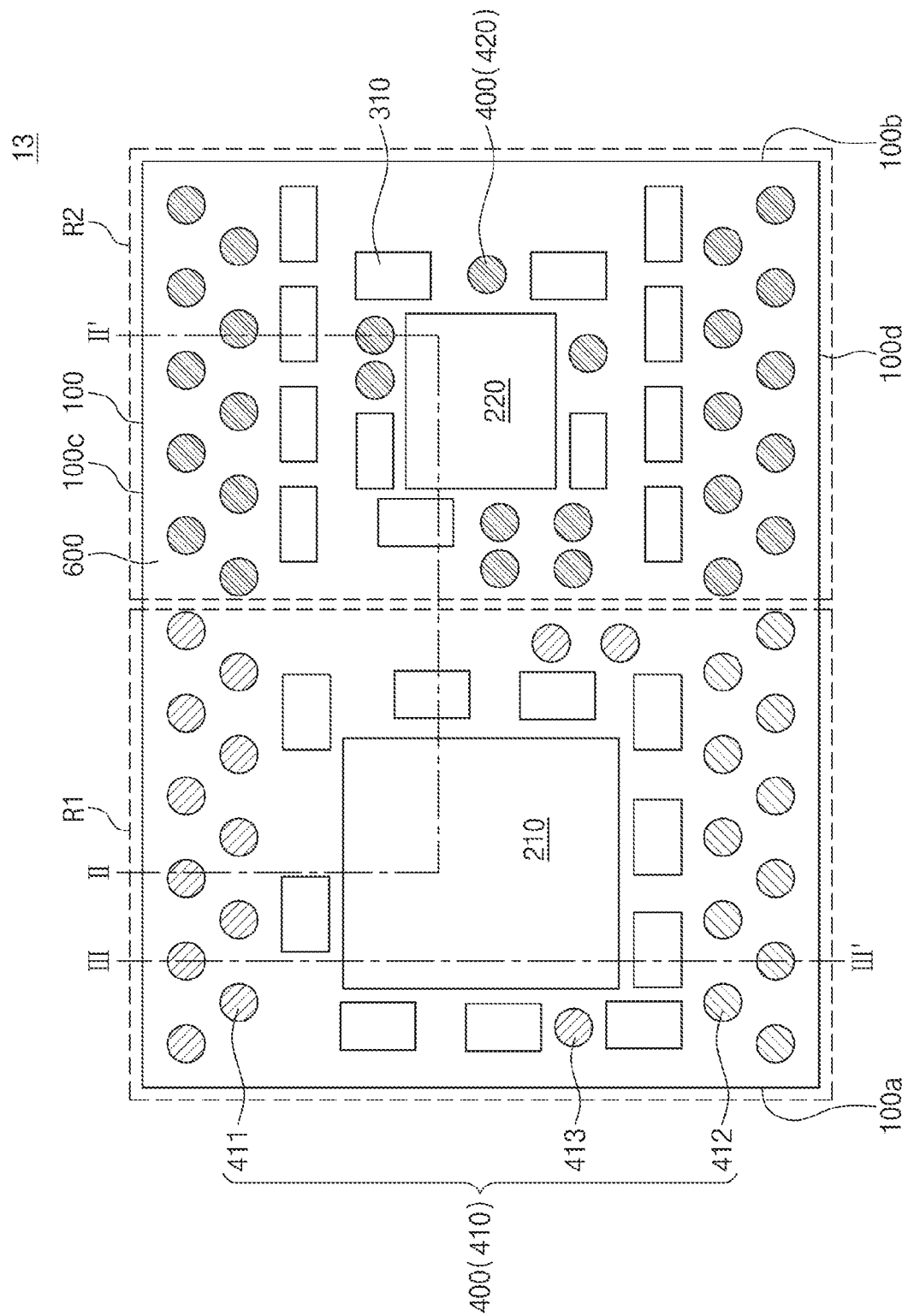
FIG. 5A is a plan view of a lower semiconductor package according to embodiments.
Figure 5B:
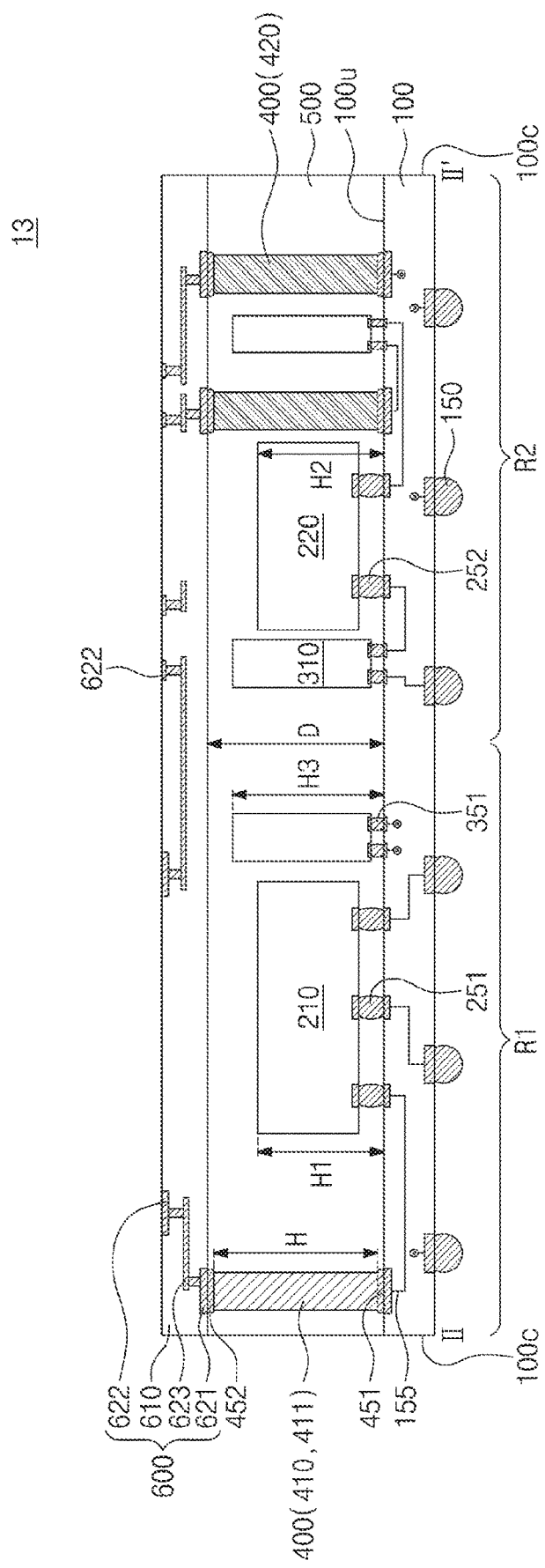
FIG. 5B is a cross-sectional view taken along the line II-II' of FIG. 5A.
Figure 5C:
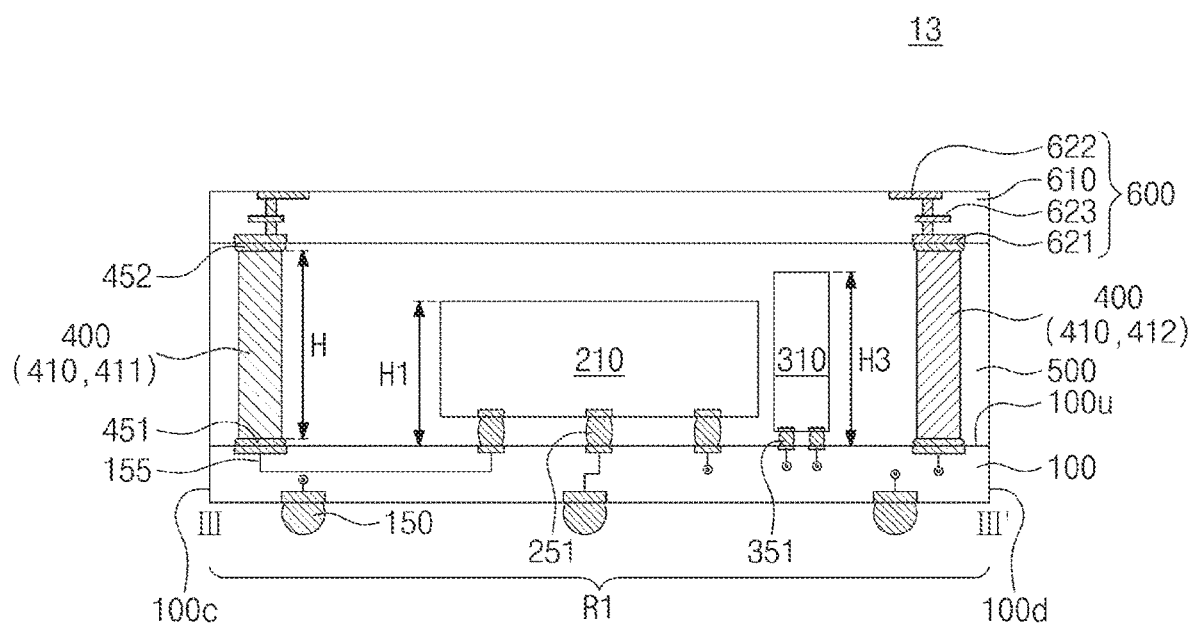
FIG. 5C is a cross-sectional view taken along the line III-III' of FIG. 5A.

FIG. 5A is a plan view of a lower semiconductor package according to embodiments. FIG. 5B is a cross-sectional view taken along the line II-IT of FIG. 5A. FIG. 5C is a cross-sectional view taken along the line III-III' of FIG. 5A.

Referring to FIGS. 5A, 5B, and 5C, the lower semiconductor package 13 includes a lower substrate 100, a first semiconductor chip 210, a second semiconductor chip 220, passive elements 310, conductive structures 400, a lower molding film 500, and an interposer substrate 600.

The conductive structure 400 may include first conductive structures 410 and second conductive structures 420. The first conductive structures 410 are provided on the first region R1 of the lower substrate 100 and may include first sub-conductive structures 411, second sub-conductive structures 412, and third sub-conductive structures 413. The first sub-conductive structures 411 may be closer to the third side 100c than the fourth side 100d of the lower substrate 100. The first sub-conductive structures 411 may be arranged in rows parallel to the second direction. The second direction may be parallel to the third side 100c of the lower substrate 100. The first sub-conductive structures 411 may include signal structures. The signal structures may be memory signal structures that deliver memory signals. In one example, the first sub-conductive structures 411 may further include a ground structure. As another example, the first sub-conductive structures 411 may further include a power supply structure, and the total number of signal structures in the first sub-conductive structures 411 may be greater than the total number of power supply structures in the first sub-conductive structures 411. As another example, the first sub-conductive structures 411 may not include a power supply structure.

The second sub-conductive structures 412 may be adjacent to the fourth side 100d of the lower substrate 100, for example. The second sub-conductive structures 412 may be arranged in rows parallel to the second direction. The second sub-conductive structures 412 function differently from the first sub-conductive structures 411 and may have different electrical connection relationships. The second sub-conductive structures 412 may include power supply structures. As another example, the second sub-conductive structures 412 further include signal structures in addition to power supply structures, and the total number of power supply structures in the second sub-conductive structures 412 may be greater than the total number of signal structures in the second sub-conductive structures 412. The second sub-conductive structures 412 may be electrically isolated from the first sub-conductive structures 411.

The third sub-conductive structures 413 may be disposed closer to the first semiconductor chip 210 than the first and second sub-conductive structures 411 and 412. The third sub-conductive structures 413 may be provided between the first semiconductor chip 210 and the passive elements 310, between the first semiconductor chip 210 and the second semiconductor chip 220, or between the passive elements 310. As another example, the third sub-conductive structures 413 may not be provided The arrangement of the first to third sub-conductive structures 411, 412, and 413 is not limited to that shown in the drawings and may be variously modified. For example, the first sub-conductive structures 411 or the second sub-conductive structures 412 are provided adjacent to the first side 100a of the lower substrate 100, and may be aligned along the first side 100a of the lower substrate 100.

The second conductive structures 420 may be provided on the second region R2 of the lower substrate 100. At least some of the second conductive structures 420 may be disposed adjacent to the third side 100c or the fourth side 100d of the lower substrate 100. Other some of the second conductive structures 420 may be provided adjacent to the second semiconductor chip 220. For example, other some of the second conductive structures 420 may be disposed between the second semiconductor chip 220 and the first semiconductor chip 210, between any one of the passive elements 310 and the second semiconductor chip 220, or between the passive elements 310. The second conductive structures 420 may include power supply structures. The external voltage may be transmitted to the second semiconductor chip 220 through the external terminals 150 and the lower substrate 100. In the process of transferring the voltage from the lower substrate 100 to the second semiconductor chip 220, the voltage may further pass through at least one of the passive elements 310. Thereafter, the power converted from the second semiconductor chip 220 may be transmitted to the second upper pad 622 through the second conductive structure 420. At this time, the power converted from the second semiconductor chip 220 may be transmitted to the second conductive structure 420 through another one among the passive elements 310. According to embodiments, the second semiconductor chip 220 functions as a power semiconductor chip and the second conductive structures 420 include power supply structures, such that the length of the power path between the external terminals 150 and the second upper pad 622 may be reduced. As the passive elements 310 are provided on the second region R2 of the lower substrate 100, the length of the power path between the external terminals 150 and the second upper pad 622 may be further reduced. The arrangement of the second conductive structures 420 is not limited to that shown in the drawing and may be variously modified. For example, the second conductive structures 420 may be adjacent to the second side 100b of the lower substrate 100 in plan view and may be aligned along the second side 100b.

The upper pad 622 is exposed on the upper surface of the interposer substrate 600 and may function as the terminals of the lower semiconductor package 13. The upper pad 622 may be provided in plurality. Some of the upper pads 622 may be electrically connected to the conductive structures 400. At least two of the upper pads 622 may be electrically connected to each other through the conductive pattern 623.

Figure 6A:
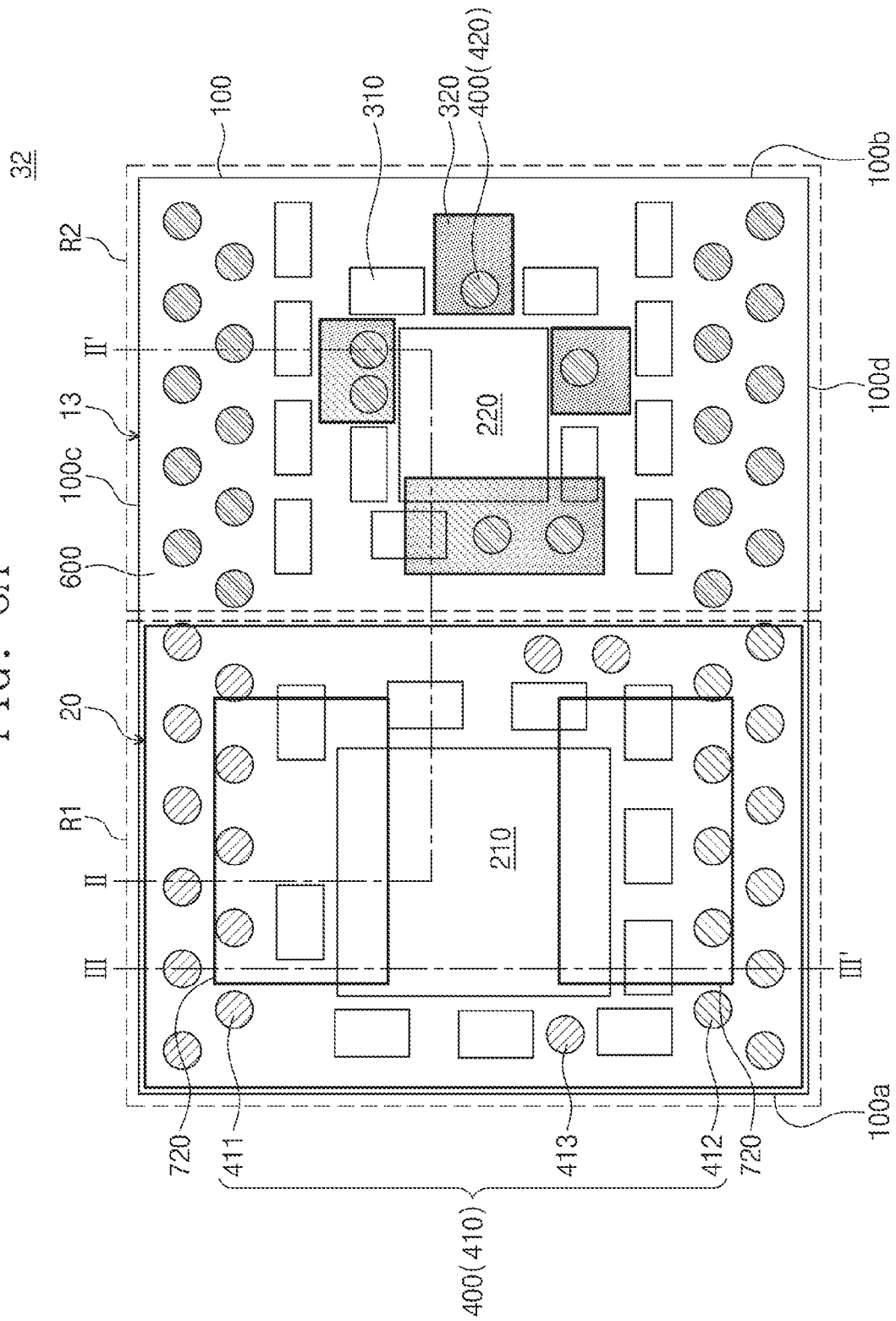
FIG. 6A is a plan view of a semiconductor package according to embodiments.
Figure 6B:
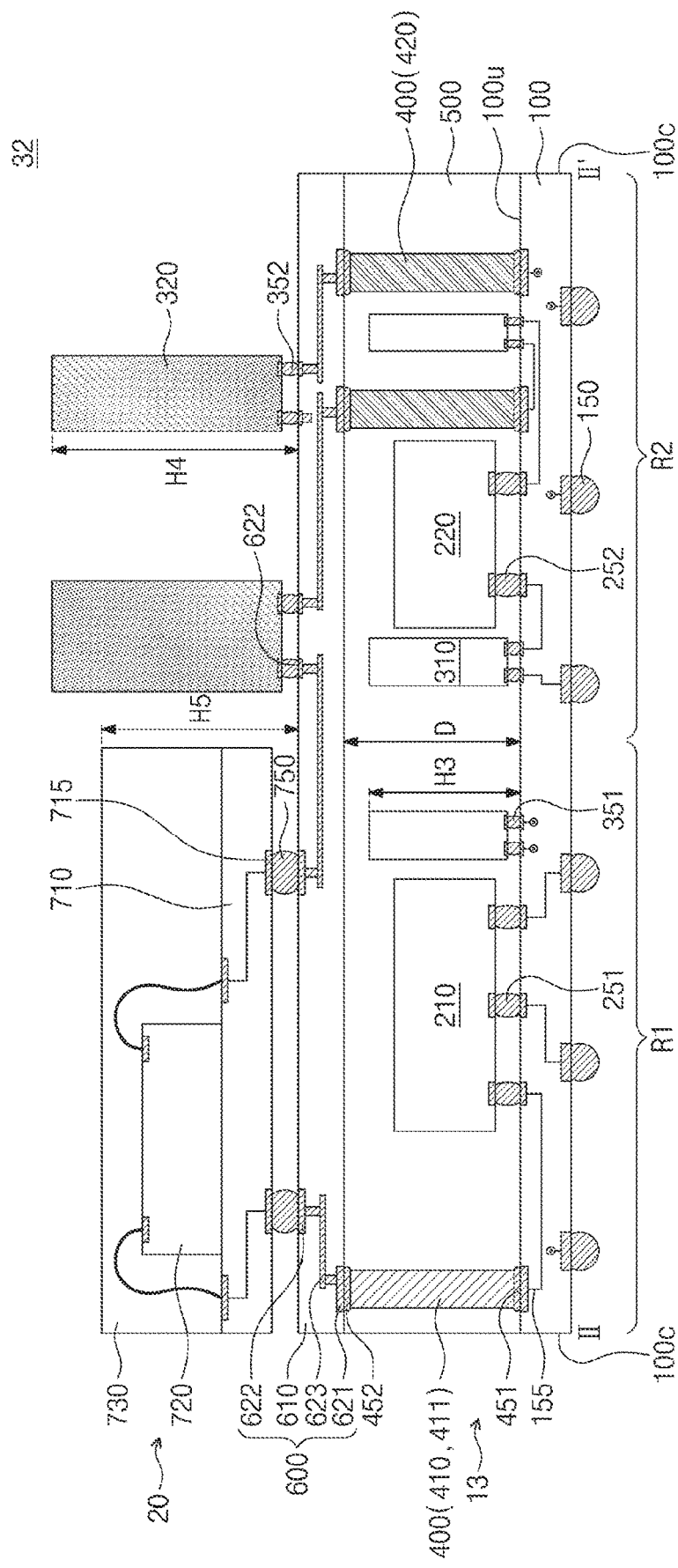
FIG. 6B is a cross-sectional view taken along the line II-IT of FIG. 6A.
Figure 6C:
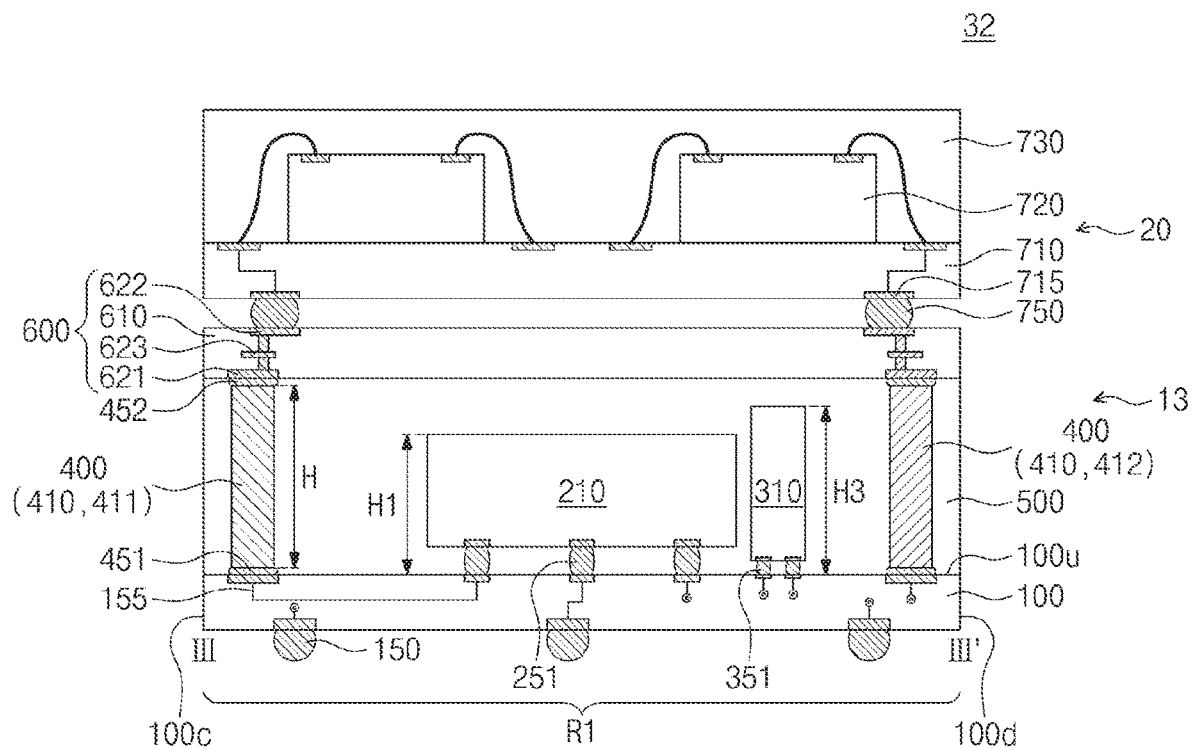
FIG. 6C is a cross-sectional view taken along the line III-III' of FIG. 6A.

FIG. 6A is a plan view of a semiconductor package according to embodiments. FIG. 6B is a cross-sectional view taken along the line II-IT of FIG. 6A. FIG. 6C is a cross-sectional view taken along the line III-III' of FIG. 6A.

Referring to FIGS. 6A and 6B, the semiconductor package 30 may include an upper passive element 320 in addition to the lower semiconductor package 13 and the upper semiconductor package 20. The lower semiconductor package 13 may be the same as that described with reference to FIGS. 5A to 5C.

The upper semiconductor package 20 may be provided on the lower semiconductor package 13. The upper semiconductor package 20 may include an upper substrate 710, a third semiconductor chip 720, and an upper molding film 730 as described with reference to FIG. 2. The width of the upper semiconductor package 20 may be less than the width of the interposer substrate 600. The upper semiconductor package 20 is provided on the first region R1 of the lower substrate 100 but may not be provided on the second region R2. The upper semiconductor package 20 may not overlap with a portion of the upper surface of the interposer substrate 600.

A conductive terminal 750 may be provided between any one of the upper pads 622 and the metal pad 715 to connect to the upper pad 622 and the metal pad 715. Accordingly, the upper semiconductor package 20 may be electrically connected to the conductive structures 400 through the interposer substrate 600. The signal of the first semiconductor chip 210 may be transmitted to and received from the third semiconductor chip 720 through the first sub-conductive structures 411. Since the first sub-conductive structures 411 overlap the upper semiconductor package 20, the length of the signal path between the upper semiconductor package 20 and the first semiconductor chip 210 and between the external terminal and the upper semiconductor package 20 may be further reduced. The second sub-conductive structures 412 may function as a power path of the third semiconductor chip 720. Since the second conductive structures 420 overlap the upper semiconductor package 20, the length of the power path between the upper semiconductor package 20 and the second conductive structures 420 may be further reduced.

The upper passive element 320 may be mounted on the upper surface of the interposer substrate 600. The upper passive element 320 may overlap the second region R2 of the lower substrate 100 in plan view. The upper passive element 320 may be laterally spaced from the upper semiconductor package 20. The upper passive element 320 may include any one of an inductor, a resistor, and a capacitor. A second connection terminal 352 may be provided between the interposer substrate 600 and the upper passive element 320. The second connection terminal 352 may include a solder or a bump. The second connection terminal 352 may include a metal such as tin, silver, and/or bismuth. The second connection terminal 352 may be connected to another one of the upper pads 622. Accordingly, the upper passive element 320 may be electrically connected to the interposer substrate 600. The upper passive element 320 may be electrically connected to the upper semiconductor package 20 through the interposer substrate 600 or may be electrically connected to the lower semiconductor package 13. For example, the power converted in the second semiconductor chip 220 is transferred to the upper semiconductor package 20 through the passive elements 310, the second conductive structures 420, the interposer substrate 600, and the upper passive elements 320.

The upper passive element 320 may have a relatively large height H4. For example, the height H4 of the mounted upper passive element 320 may be greater than the height H3 of the passive element 310. The height H4 of the mounted upper passive element 320 may be greater than the gap D between the lower substrate 100 and the interposer substrate 600. The height H4 of the mounted upper passive element 320 may be greater than the height H5 of the mounted upper semiconductor package 20. In this case, the height H4 of the mounted upper passive element 320 may include the height of the second connection terminal 352. The height H5 of the mounted upper semiconductor package 20 may include the height of the conductive terminal 750. For example, the height H5 of the upper semiconductor package 20 may include the height of the conductive terminal 750, the height of the upper substrate 710, and the height of the upper molding film 730. According to embodiments, the width and arrangement of the upper semiconductor package 20 may be adjusted such that the upper passive element 320 may be further mounted on the lower semiconductor package 13. Thus, the length of the power path between the upper passive element 320 and the second semiconductor chip 220 may be further reduced. The upper passive element 320 may be provided in a plurality, but is not limited thereto.

Figure 7A:
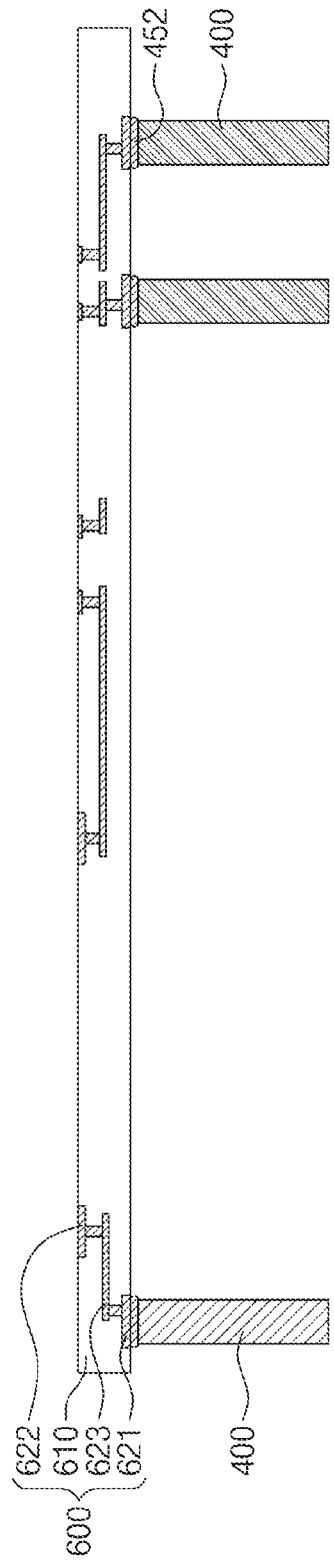
FIGS. 7A to 7C are views for explaining a method of manufacturing a lower semiconductor package according to embodiments.
Figure 7B:
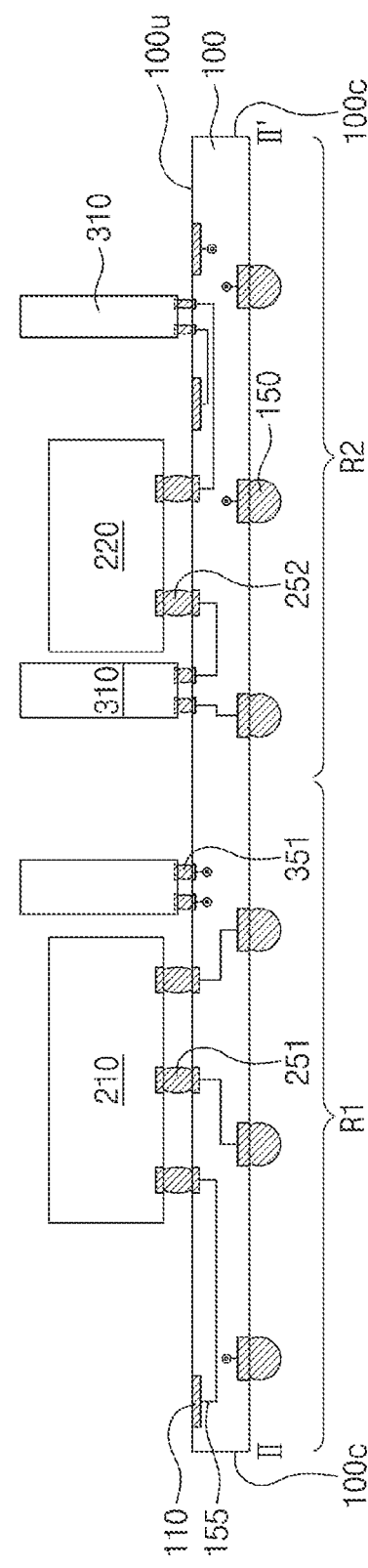
Figure 7C:
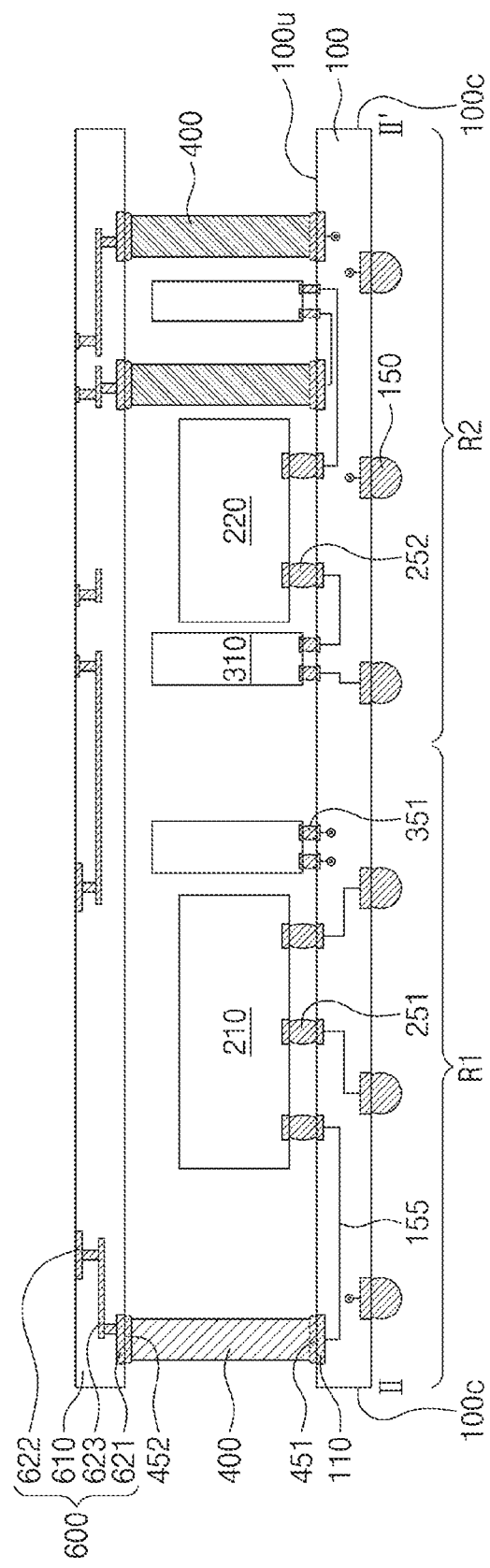

FIGS. 7A to 7C are views for explaining a method of manufacturing a lower semiconductor package according to embodiments, and correspond to sections taken along the line II-IT of FIG. 5A.

Referring to FIG. 7A, conductive structures 400 may be attached on the lower surface of an interposer substrate 600. The lower pad 621 may be provided in a plurality on the lower surface of the interposer substrate 600. The conductive structures 400 may be provided on the lower surface of the interposer substrate 600 such that the conductive structures 400 are aligned with the lower pads 621, respectively. A plurality of upper solder connection portions 452 may be formed between the conductive structures 400 and the lower pads 621, respectively. The conductive structures 400 may be physically and electrically connected to the interposer substrate 600 through the upper solder connection portions 452. The upper solder connection portions 452 may be manufactured through a soldering process by heat treatment or a thermo-compression process. The heat treatment may be performed at a temperature condition equal to or higher than the melting point of the upper solder connection portions 452. The melting point of the conductive structure 400 may be higher than that of the heat treatment temperature. The shape of the conductive structure 400 may be maintained during the heat treatment process.

Referring to FIG. 7B, the first semiconductor chip 210, the second semiconductor chip 220, and the passive elements 310 may be mounted on the lower substrate 100. The mounting of the first semiconductor chip 210 may be performed by a surface mounting technique or a reflow process using ultraviolet rays. As another example, the mounting of the first semiconductor chip 210 may be performed by a bonding process using heat or a laser. The mounting of the second semiconductor chip 220 may be performed by a surface mounting technique or a reflow process using ultraviolet rays. The mounting of the passive elements 310 may be performed by surface mounting techniques. The order of the mounting of the first semiconductor chip 210, the mounting of the second semiconductor chip 220, and the mounting of the passive elements 310 may be variously modified.

Referring to FIG. 7C, in order to allow the conductive structures 400 to face the lower substrate 100, the interposer substrate 600 may be provided on the first semiconductor chip 210, the second semiconductor chip 220, and the passive elements 310. In this case, the interposer substrate 600 to which the conductive structures 400 described with reference to FIG. 7A are connected may be used. The conductive structures 400 may be aligned with the substrate pads 110, respectively. The conductive structures 400 may be spaced apart from the first semiconductor chip 210, the second semiconductor chip 220, and the passive elements 310 in plan view.

A plurality of lower solder connection portions 451 may be formed between the conductive structures 400 and the substrate pads 110, respectively. The lower solder connection portions 451 may be manufactured through a soldering process by heat treatment or a thermo-compression process. The conductive structures 400 may be physically and electrically connected to the lower substrate 100 by the lower solder connection portions 451. The heat treatment may be performed at a temperature equal to or higher than the melting point of the lower solder connection portions 451. The conductive structure 400 may have a melting point greater than the temperature of the heat treatment to maintain the shape of the conductive structure 400 during the heat treatment process.

Referring again to FIGS. 5A and 5B, a lower molding film 500 may be formed to fill a gap between the lower substrate 100 and the interposer substrate 600. The formation of the lower molding film 500 may be formed by injection and curing of a molding material. The lower molding film 500 may further fill the gaps between the first semiconductor chip 210 and the interposer substrate 600, between the second semiconductor chip 220 and the interposer substrate 600, and between the passive elements 310 and the interposer substrate 600. After that, external terminals 150 may be formed on the lower surface of the lower substrate 100. Thus, the lower semiconductor package 13 described with reference to FIGS. 5A and 5B may be manufactured.

Figure 8A:
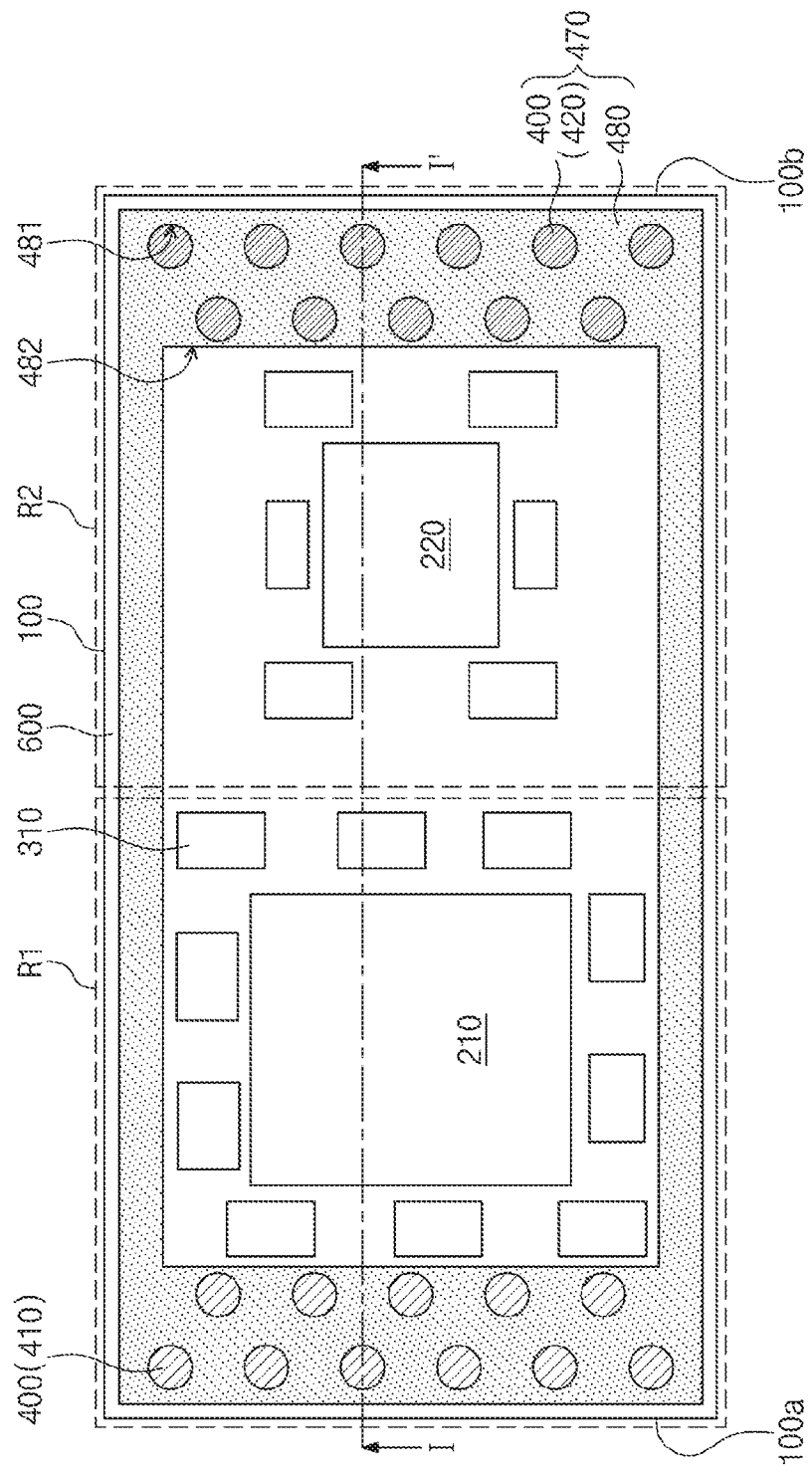
FIG. 8A is a plan view of a lower semiconductor package according to embodiments.
Figure 8B:
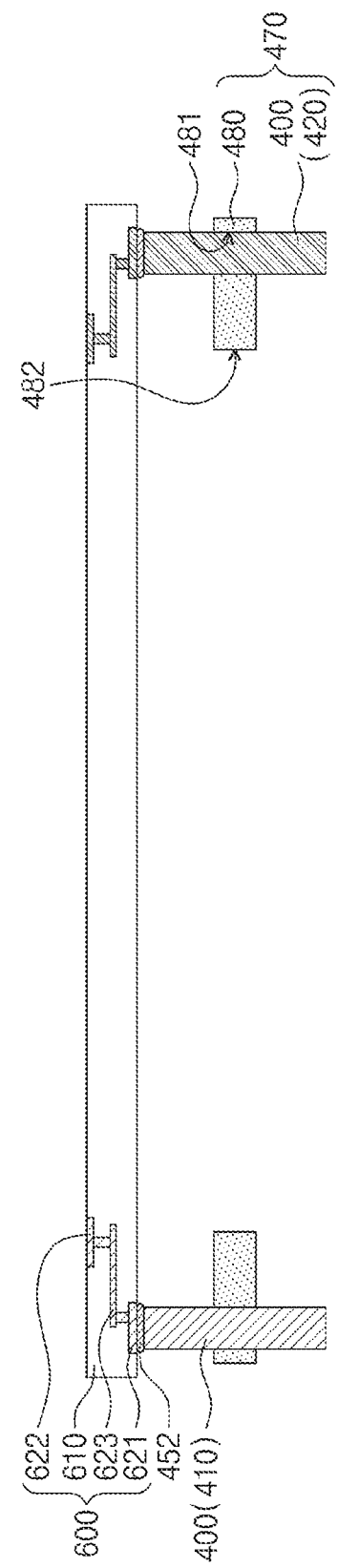
FIGS. 8B and 8C are views for explaining a method of manufacturing a lower semiconductor package according to embodiments.
Figure 8C:
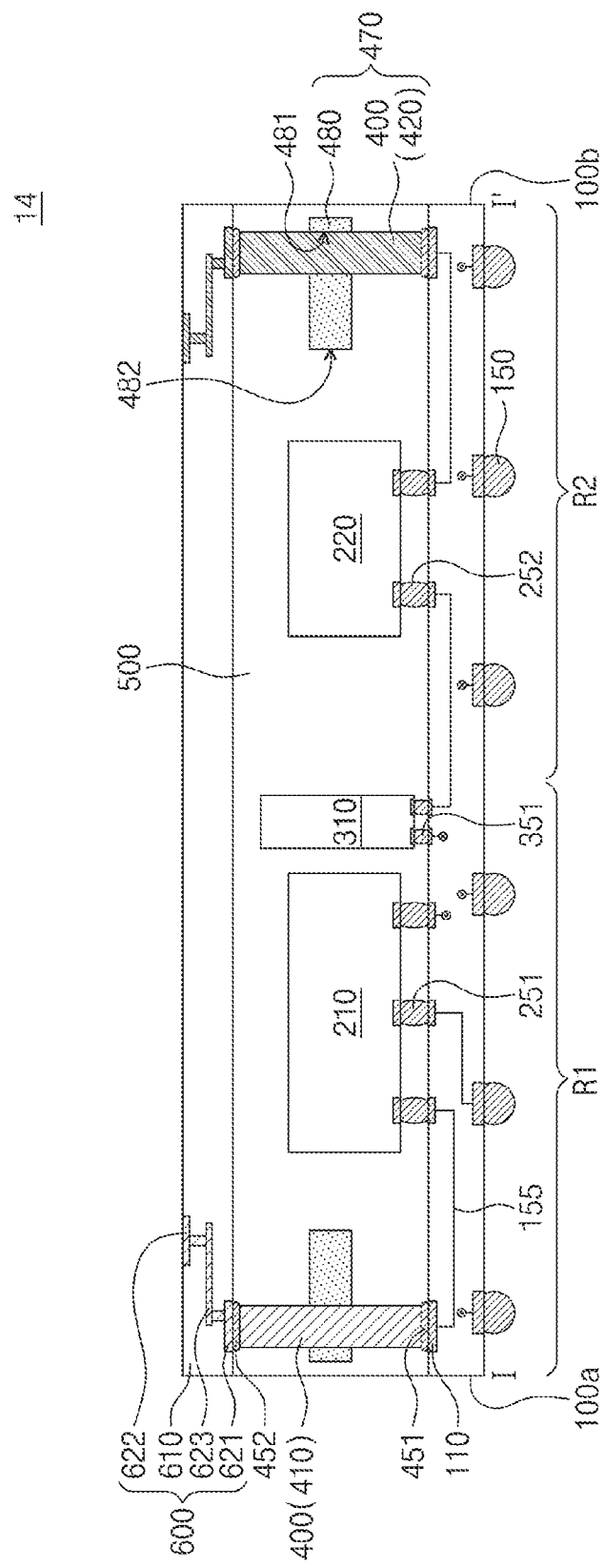

FIG. 8A is a plan view of a lower semiconductor package according to embodiments. FIGS. 8B to 8C are views for explaining a method of manufacturing a lower semiconductor package according to embodiments, and correspond to sections taken along the line I-I' of FIG. 8A.

Referring to FIGS. 8A and 8B, a bonding structure 470 may be provided on the lower surface of the interposer substrate 600. The bonding structure 470 may include conductive structures 400 and a fixing portion 480. The fixing portion 480 may have a plate shape. The fixing portion 480 may include plastic or polymer. The fixing portion 480 may have first holes 481 and second holes 482 penetrating thereof. The conductive structures 400 may be inserted into the first holes 481 of the fixing portion 480. Accordingly, the conductive structures 400 may be provided on the interposer substrate 600 together with the fixing portion 480. The second holes 482 of the fixing portion 480 may be spaced apart from the first holes 481. The conductive structures 400 may not be provided in the second hole 482.

The conductive structures 400 may be connected to the interposer substrate 600. The connection of the conductive structures 400 and the interposer substrate 600 may include forming upper solder connection portions 452 between the conductive structures 400 and the lower pads 621, respectively. While the conductive structures 400 are connected to the interposer substrate 600, the pitch and arrangement of the conductive structures 400 may be easily controlled by the fixing portion 480. The conductive structure 400 may include the first conductive structures 410 and the second conductive structures 420 described with reference to FIGS. 1A and 1B.

Referring to FIGS. 8A and 8C, the first semiconductor chip 210, the second semiconductor chip 220, and the passive elements 310 may be mounted on the lower substrate 100. In order to allow the conductive structures 400 to face the lower substrate 100, the interposer substrate 600 may be provided on the first semiconductor chip 210, the second semiconductor chip 220, and the passive elements 310. At this time, the first semiconductor chip 210, the second semiconductor chip 220, and the passive elements 310 may be provided in the second hole 482 of the fixing portion 480. The first semiconductor chip 210, the second semiconductor chip 220, and the passive elements 310 may be spaced apart from the fixing portion 480. Lower solder connection portions 451 may be formed between the conductive structures 400 and the substrate pads 110 to connect the conductive structures 400 to the lower substrate 100.

Then, a lower molding film 500 may be formed to fill the gap between the lower substrate 100 and the interposer substrate 600. The lower molding film 500 may cover the upper surface, lower surface, and side walls of the fixing portion 480. The lower molding film 500 may include a material different from that of the fixing portion 480. External terminals 150 may be formed on the lower surface of the lower substrate 100. Thus, the fabrication of the lower semiconductor package 14 may be completed.

The upper semiconductor package 20 described with reference to FIG. 3 may be mounted on the lower semiconductor package 14 of FIGS. 8A to 8C to manufacture a semiconductor package.

Figure 9B:
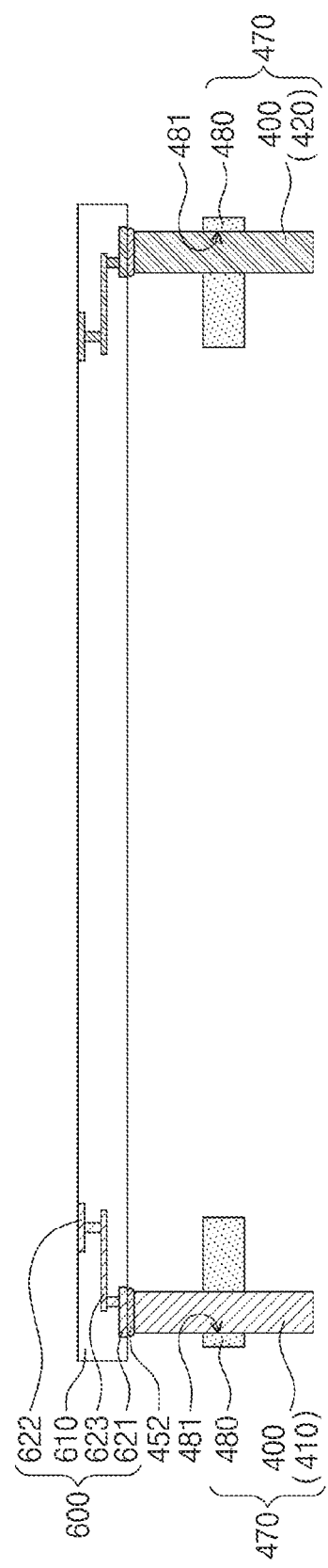
FIGS. 9B and 9C are views for explaining a method of manufacturing a lower semiconductor package according to embodiments.
Figure 9C:
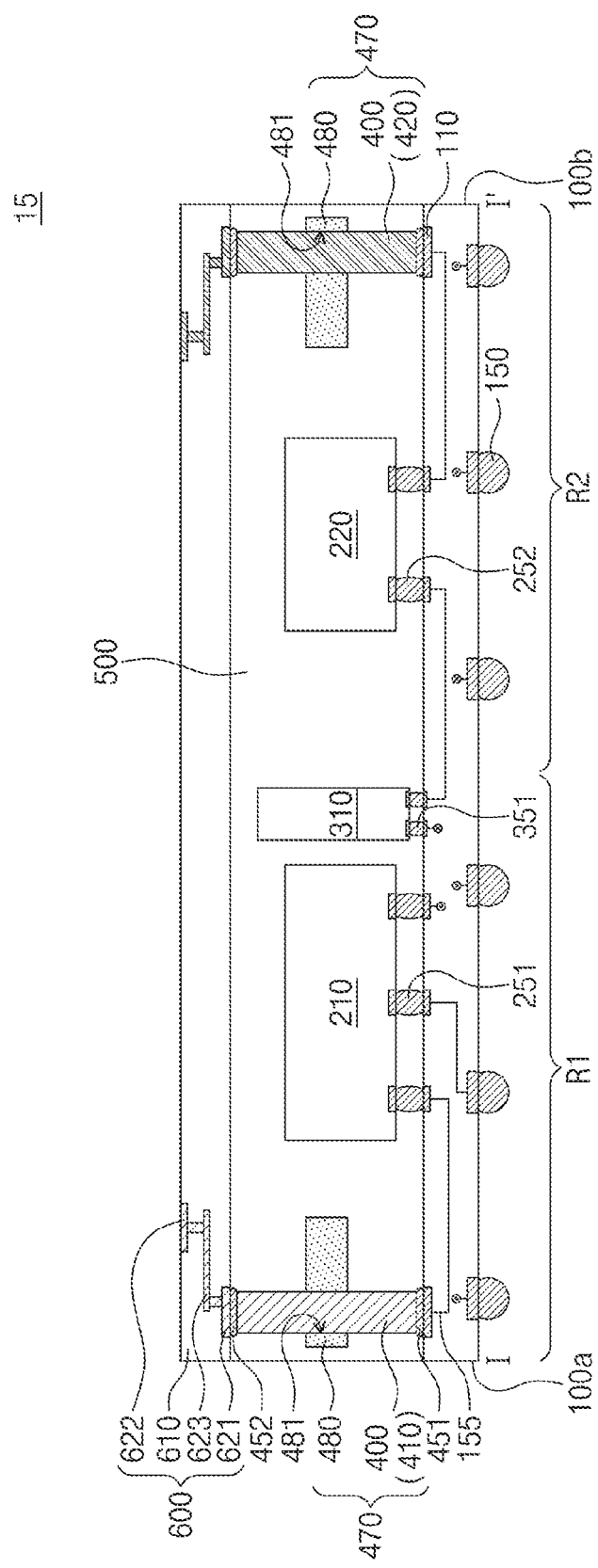

FIG. 9A is a plan view of a lower semiconductor package according to embodiments. FIGS. 9B to 9C are views for explaining a method of manufacturing a lower semiconductor package according to embodiments, and correspond to sections taken along the line I-I' of FIG. 9A.

Referring to FIGS. 9A and 9B, a bonding structure 470 may be provided on the lower surface of the interposer substrate 600. The bonding structure 470 may include conductive structures 400 and a fixing portion 480. The bonding structure 470 may be similar to that described with reference to FIGS. 8A and 8B. However, the bonding structures 470 may be provided in plurality, and a fixing portion 480 of each bonding structure 470 may not have the second holes 482. Any one of the bonding structures 470 may be provided on the first region R1 of the lower substrate 100. Another one of the bonding structures 470 may be provided on the second region R2 of the lower substrate 100.

Upper solder connection portions 452 may be formed between the conductive structures 400 and the interposer substrate 600 to connect the conductive structures 400 to the interposer substrate 600. The conductive structure 400 may include the first conductive structures 410 and the second conductive structures 420 shown in FIGS. 1A and 1B.

Referring to FIGS. 9A and 9C, the first semiconductor chip 210, the second semiconductor chip 220, and the passive elements 310 may be mounted on the lower substrate 100. In order to allow the bonding structures 470 to face the lower substrate 100, the interposer substrate 600 may be provided on the first semiconductor chip 210, the second semiconductor chip 220, and the passive elements 310. At this time, the bonding structures 470 may be spaced apart from the first semiconductor chip 210, the second semiconductor chip 220, and the passive elements 310. Lower solder connection portions 451 may be formed between the conductive structures 400 and the substrate pads 110, respectively.

The lower molding film 500 may be formed to fill the gap between the lower substrate 100 and the interposer substrate 600. The lower molding film 500 may cover the upper surface, lower surface, and side walls of each fixing portion 480. External terminals 150 may be formed on the lower surface of the lower substrate 100. Thus, the lower semiconductor package 15 may be manufactured. The lower semiconductor package 15 may include a plurality of bonding structures 470.

The upper semiconductor package 20 described with reference to FIG. 3 may be mounted on the lower semiconductor package 15 manufactured as shown in FIGS. 9A to 9C to manufacture a semiconductor package.

Figure 10A:
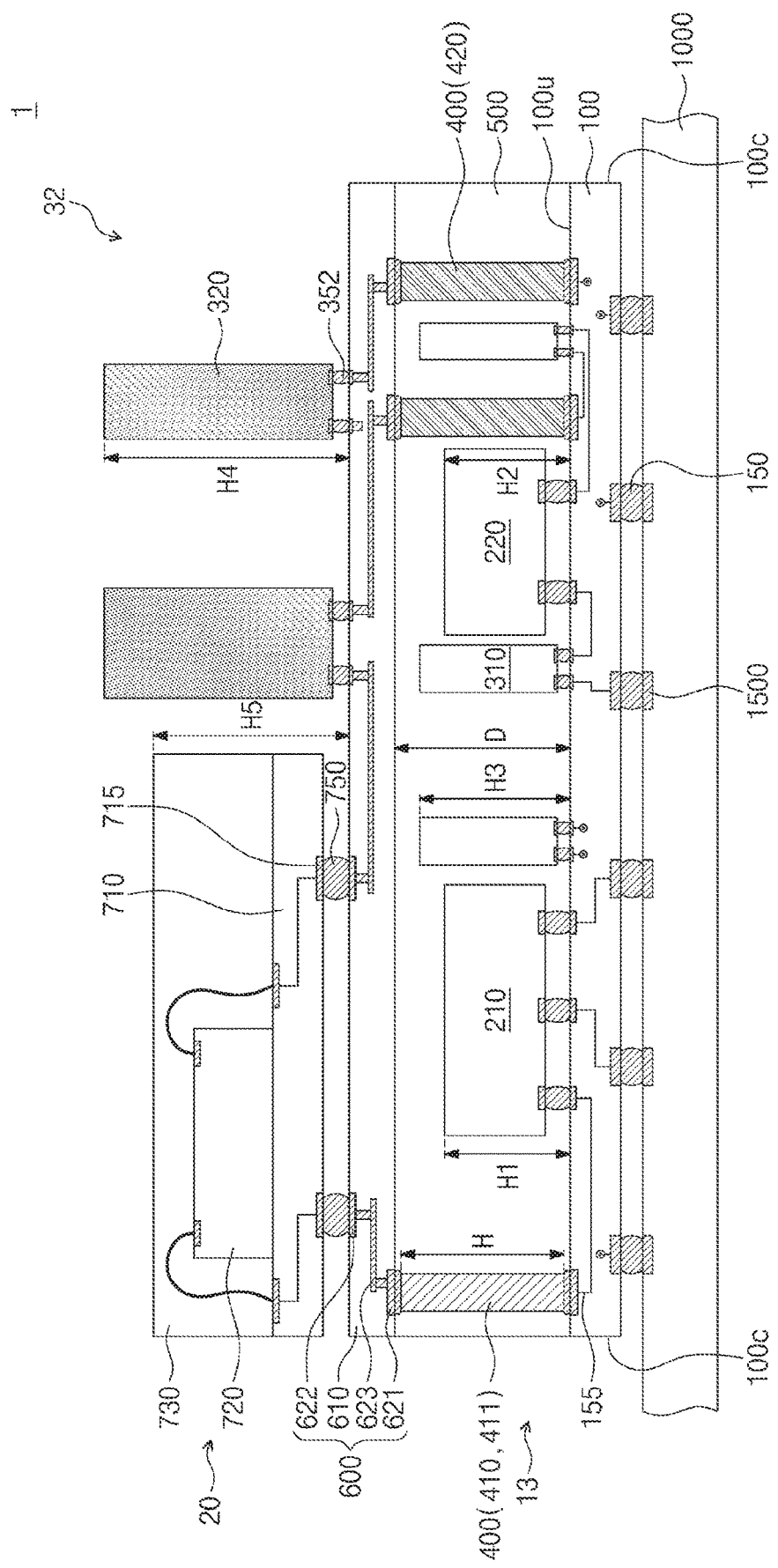
FIG. 10A is a view for explaining a semiconductor module according to embodiments.
Figure 10B:
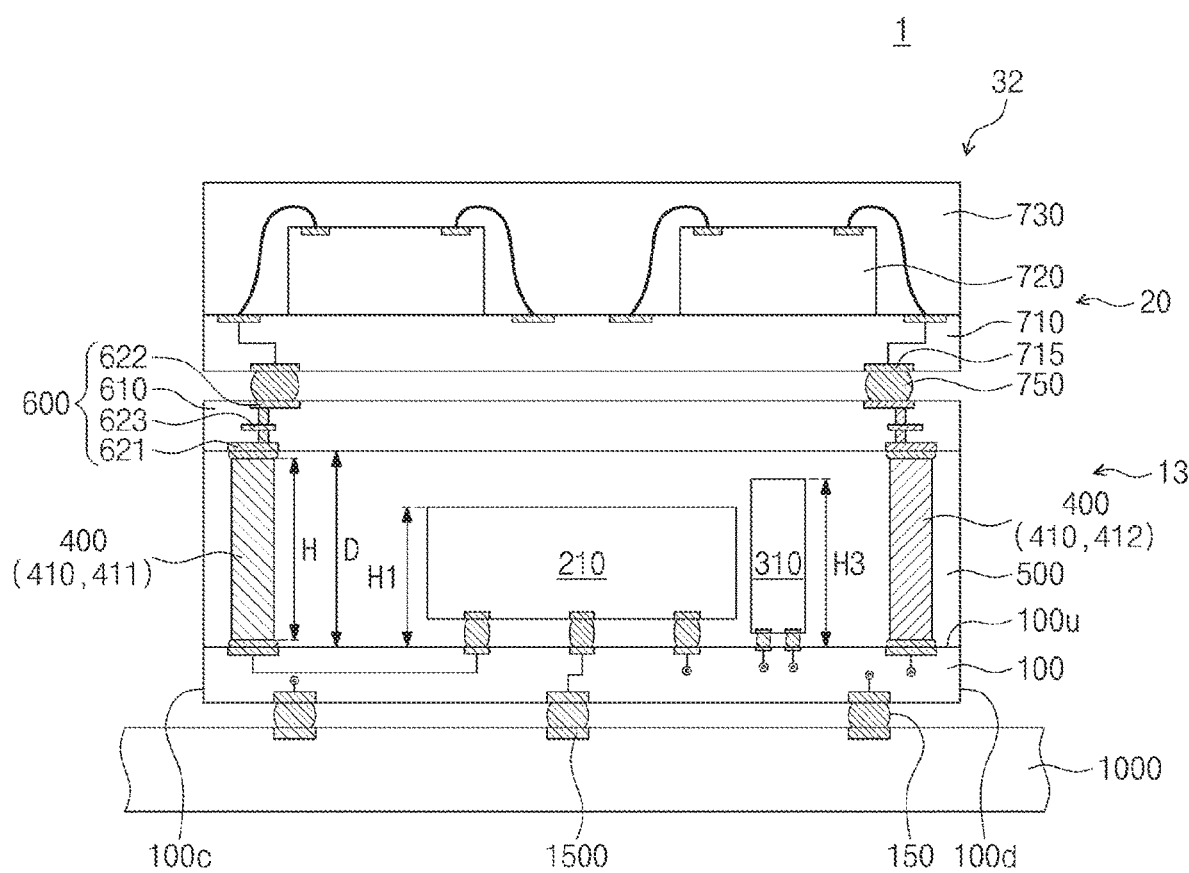
FIG. 10B is a view for explaining a semiconductor module according to embodiments.
Figure 10C:
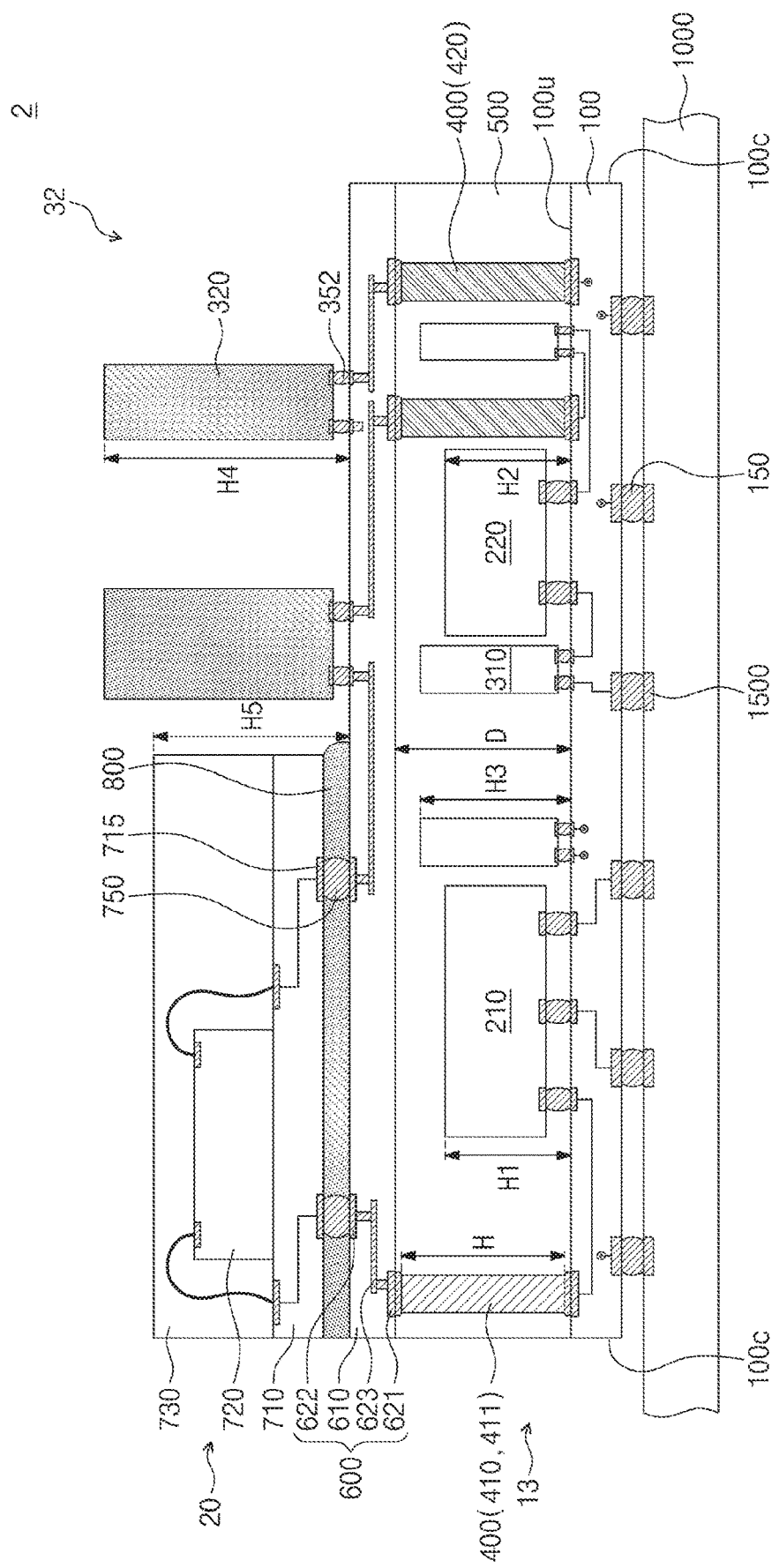
FIGS. 10C and 10D are views for explaining a semiconductor module according to embodiments.
Figure 10D:
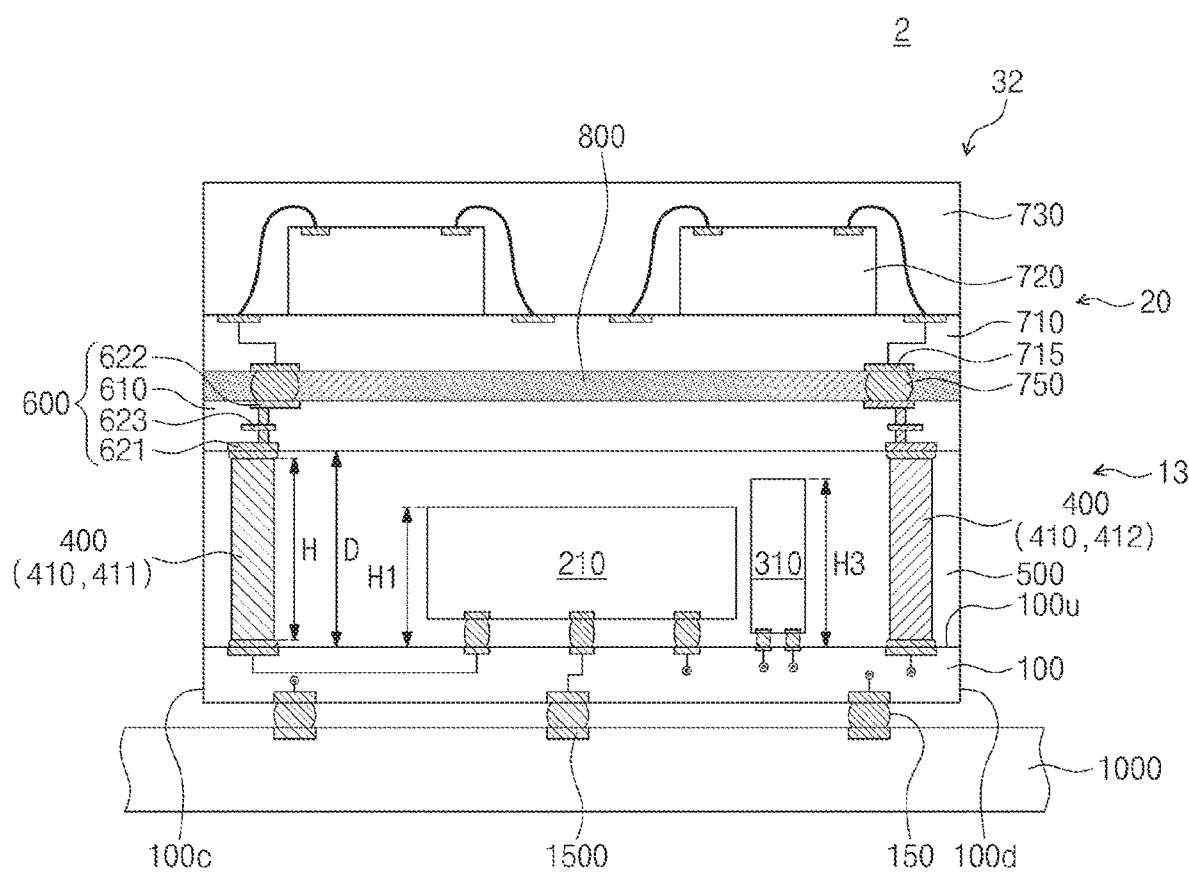

FIGS. 10A and 10B are views for explaining the semiconductor module according to embodiments, and correspond to a section taken along the line II-II' in FIG. 6A and a section taken along the line III-III' in FIG. 6A, respectively. FIGS. 10C and 10D are views for explaining the semiconductor module according to embodiments, and correspond to a section taken along the line II-II' in FIG. 6A and a section taken along the line III-III' in FIG. 6A, respectively.

Referring to FIGS. 10A through 10D, semiconductor modules 1 and 2 may include a board 1000 and a semiconductor package 32. A printed circuit board may be used as the board 1000. For example, the semiconductor package 32 described with reference to FIGS. 6A and 6B may be mounted on the board 1000 so that the semiconductor modules 1 and 2 may be manufactured. Unlike what is shown, the semiconductor package 30 of FIG. 3 or the semiconductor package 31 of FIGS. 4A and 4B may be mounted on the board 1000. As another example, the upper semiconductor package 20 is staked on the lower semiconductor package 14 of FIGS. 8A to 8C or the lower semiconductor package 15 manufactured as shown in FIGS. 9A to 9C, such that a semiconductor package may be manufactured, and the semiconductor package may be mounted on the board 1000. The board 1000 may have connection pads 1500 on its upper surface. The external terminals 150 may be connected to the connection pads 1500. The semiconductor package 32 may be electrically connected to the board 1000 through the external terminals 150.

The height H3 of the passive elements 310 and the height H4 of the upper passive elements 320 may be relatively large. When the passive elements 310 and the upper passive elements 320 are mounted directly on the board 1000, the passive elements 310 and the upper passive elements 320 may be connected to the semiconductor package 32 through the board 1000. In this case, the length of the electrical connection path of the semiconductor modules 1 and 2 may be increased.

According to embodiments, since the conductive structures 400 are used, the passive elements 310 may be provided between the lower substrate 100 and the interposer substrate 600. Thus, the length of the electrical path between the first to third semiconductor chips 210, 220, 720 and the passive elements 310 may be reduced. As the upper passive elements 320 are provided on the interposer substrate 600, the length of the electrical path between the upper passive elements 320 and the lower semiconductor package 13 or between the upper passive elements 320 and the upper semiconductor package 20 may be reduced. The semiconductor modules 1 and 2 may have improved electrical properties. The semiconductor modules 1 and 2 may be miniaturized.

As shown in FIGS. 10A and 10B, an underfill film may not be provided between the lower semiconductor package 13 and the upper semiconductor package 20.

As shown in FIGS. 10C and 10D, the underfill film 800 may further be provided in the gap between the lower semiconductor package 13 and the upper semiconductor package 20 to seal the conductive terminals 750. The underfill film 800 may include an insulating polymer. The underfill film 800 may have a higher thermal conductivity than that of air. In operation of the lower semiconductor package 13, heat generated in the lower semiconductor package 13 may be discharged to the outside faster through the underfill film 800. Similarly, in operation of the upper semiconductor package 20, heat generated in the upper semiconductor package 20 may be discharged to the outside faster through the underfill film 800. The underfill film 800 may protect the external terminals 150.

According to embodiments, as shown in FIG. 10C, since the width of the upper semiconductor package 20 is smaller than that of the interposer substrate 600, the underfill film 800 may be easily formed between the interposer substrate 600 and the upper semiconductor package 20. The underfill film 800 may not extend into the gap between the interposer substrate 600 and the upper passive element 320.

According to the embodiments, since the gap D between the lower substrate 100 and the interposer substrate 600 is large, the lower semiconductor package 13 may have a relatively large height. Even if a lower underfill film (not shown) is formed between the board 1000 and the semiconductor package 32, a separate underfill film 800 may be formed between the lower semiconductor package 13 and the upper semiconductor package 20. The underfill film 800 may not extend between the board 1000 and the semiconductor package 32. The formation of the underfill film 800 may be performed after the semiconductor package 32 is mounted on the board 1000.

Figure 11A:
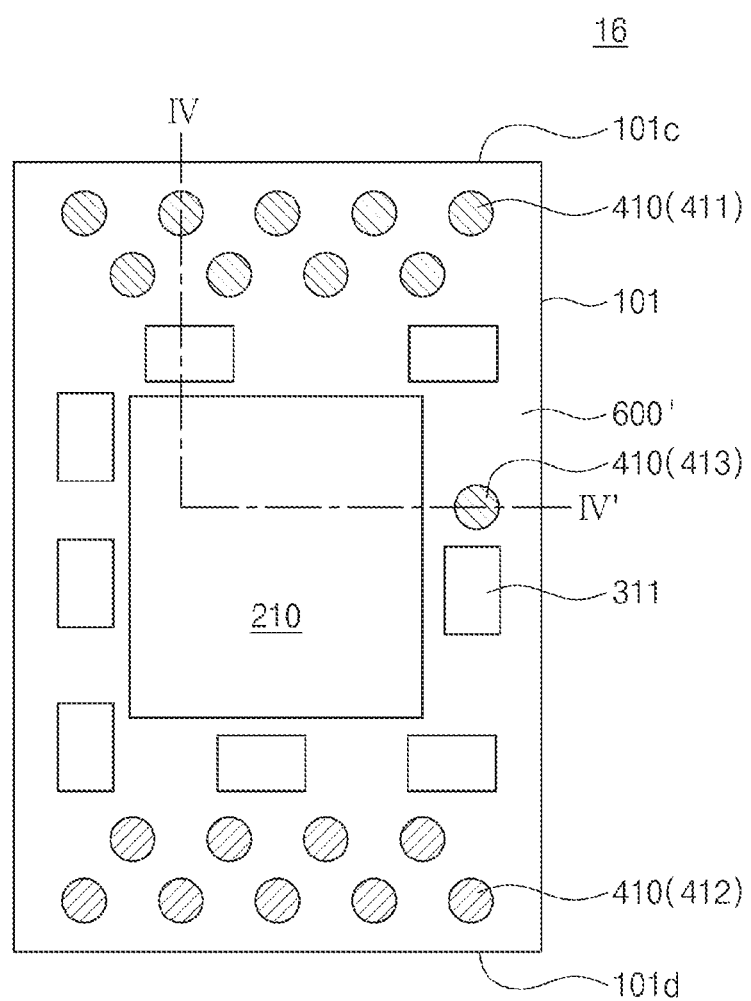
FIG. 11A is a plan view showing a first lower semiconductor package according to embodiments.
Figure 11B:
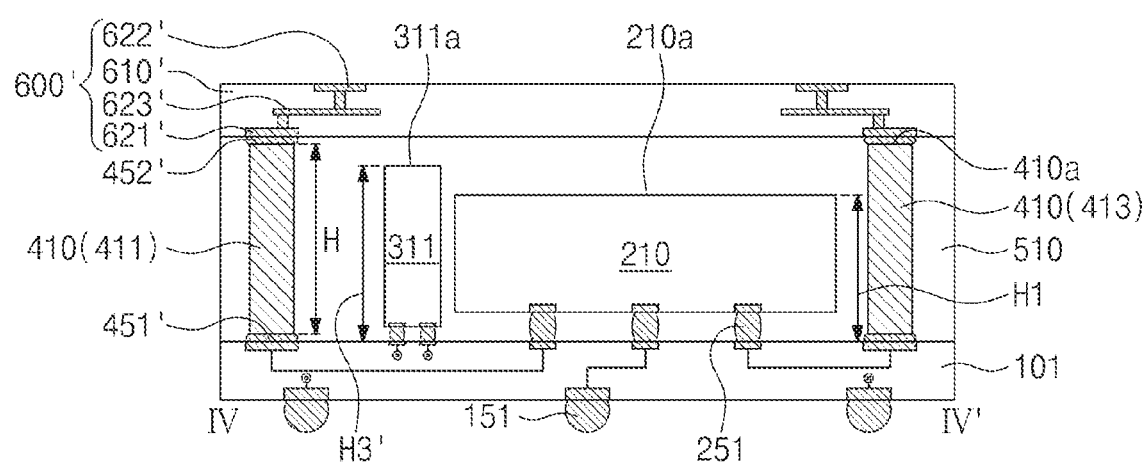
FIG. 11B is a cross-sectional view taken along the line IV-IV' of FIG. 11A.

FIG. 11A is a plan view showing a first lower semiconductor package according to embodiments. FIG. 11B is a cross-sectional view taken along the line IV-IV' of FIG. 11A.

Referring to FIGS. 11A and 11B, the first lower semiconductor package 16 includes a first lower substrate 101, a first semiconductor chip 210, first conductive structures 410, first passive elements 311, and a first interposer substrate 600'. The first lower substrate 101, the first semiconductor chip 210, and the first conductive structures 410 may be substantially identical to the lower substrate 100, the first semiconductor chip 210, and the first conductive structures 410 of the example of FIGS. 5A to 5C, respectively. The first passive elements 311 may be substantially the same as those described in the example of the passive elements 310 on the first region R1 of the lower substrate 100 of FIGS. 5A to 5C. For example, the height H3' of at least one of the mounted first passive elements 311 may be greater than the height H1 of the mounted first semiconductor chip 210. At least one of the upper surfaces 311a of the first passive elements 311 is provided at a higher level than the upper surface 210a of the first semiconductor chip 210.

The first conductive structures 410 may have substantially the same electrical connection relationship as described in the example of the first conductive structures 410 of FIGS. 5A to 5C. For example, the first conductive structures 410 may include first sub-conductive structures 411, second sub-conductive structures 412, and third sub-conductive structures 413. The first sub-conductive structures 411 are disposed adjacent to one side 101c of the first lower substrate 101 and may include signal structures. The second sub-conductive structures 412 may be disposed adjacent to the other side 101d of the first lower substrate 101. One side 101c of the first lower substrate 101 may be opposite to the other side 101d. The third sub-conductive structures 413 may be provided between the first semiconductor chip 210 and the first passive elements 311 or between the first passive elements 311. The third sub-conductive structures 413 may be provided in the center region of the first lower substrate 101 in plan view. As another example, the third sub-conductive structures 413 may not be provided. The first conductive structures 410 may function as an electrical path between the first lower substrate 101 and the first interposer substrate 600'.

The height H of the first conductive structure 410 may be greater than the height H3' of the passive elements 310 and the height H1 of the mounted first semiconductor chip 210. The upper surface 410a of the first conductive structure 410 may be provided at a higher level than the upper surfaces 311a of the first passive elements 311 and the upper surface 210a of the first semiconductor chip 210.

First lower solder connection portions 451' are provided between the first lower substrate 101 and the first conductive structures 410, and first upper solder connection portions 452' may be provided between the first conductive structures 410 and the first interposer substrate 600'. The first lower solder connection portions 451' and the first upper solder connection portions 452' may be identical to the lower solder connection portions 451 and the upper solder connection portions 452, respectively, which are described with reference to FIGS. 1A and 1B.

The first interposer substrate 600' may include a first insulating layer 610', a first lower pad 621', a first conductive pattern 623', and a first upper pad 622'. The first insulating layer 610', the first lower pad 621', the first conductive pattern 623', and the first upper pad 622' may be similar to the insulating layer 610, the lower pad 621, the conductive pattern 623, and the upper pad 622 described with reference to FIGS. 1A to 1C, respectively. The first interposer substrate 600' may be electrically connected to the first semiconductor chip 210 or the first passive elements 311 through the conductive structures 400 and the first lower substrate 101.

The first lower molding film 510 may be provided between the first lower substrate 101 and the first interposer substrate 600' to seal the first semiconductor chip 210 and the first passive element 311. The first lower molding film 510 may cover the sidewalls of the first conductive structures 410. The first lower molding film 510 may include an epoxy molding compound.

The first external terminals 151 may be provided on the lower surface of the first lower substrate 101. The first external terminals 151 may be substantially the same as the external terminals 150 described with reference to FIGS. 1A and 1B. The first semiconductor package 41 may not include the second semiconductor chip 220.

Figure 11C:
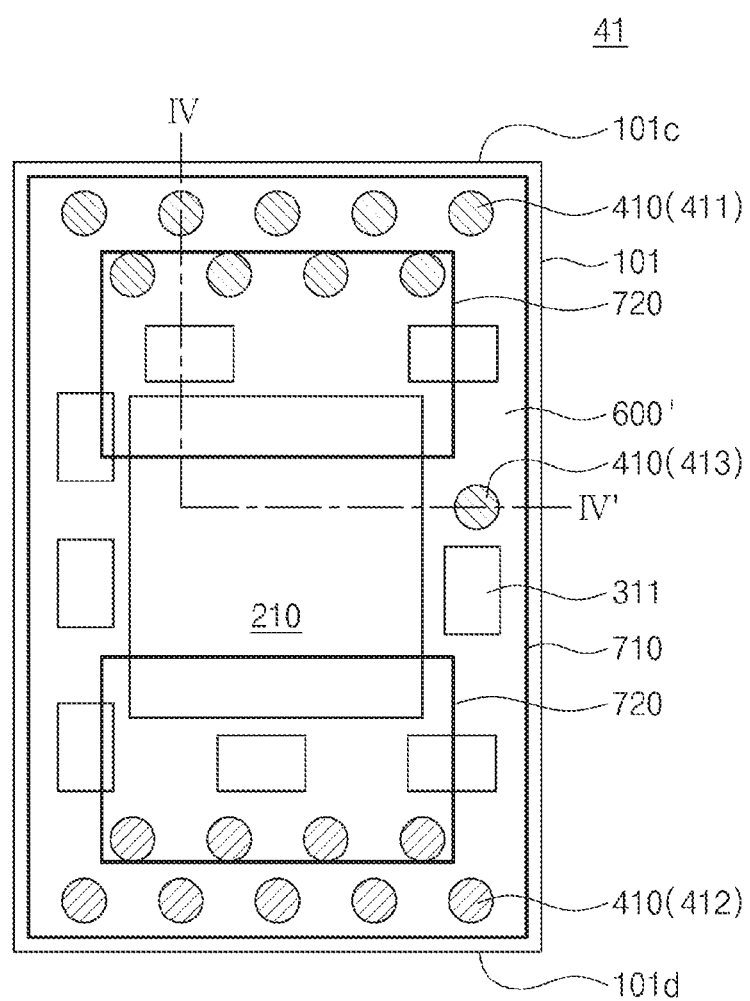
FIG. 11C is a plan view showing a first semiconductor package according to embodiments.
Figure 11D:
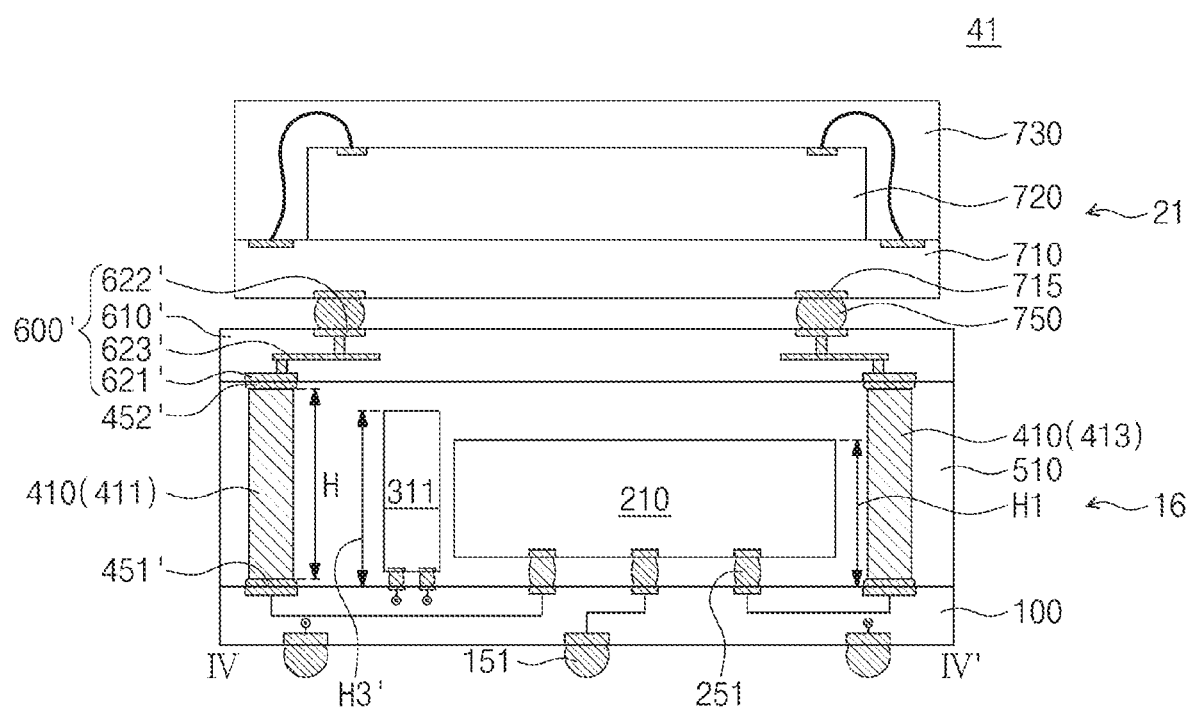
FIG. 11D is a cross-sectional view taken along the line IV-IV' of FIG. 11C.

FIG. 11C is a plan view showing a first semiconductor package according to embodiments. FIG. 11D is a cross-sectional view taken along the line IV-IV' of FIG. 11C.

Referring to FIGS. 11C and 11D, the first semiconductor package 41 may include a first lower semiconductor package 16 and a first upper semiconductor package 21. The first lower semiconductor package 16 may be the same as that described with reference to FIGS. 11A and 11B. The first upper semiconductor package 21 may be stacked on the first lower semiconductor package 16. The first upper semiconductor package 21 may include an upper substrate 710, a third semiconductor chip 720, and an upper molding film 730 that are substantially the same as those described with reference to FIG. 3. The first upper semiconductor package 21 may be smaller than the first lower semiconductor package 16. For example, the first upper semiconductor package 21 may have a smaller width than that of the first lower semiconductor package 16. Here, the width of the component may mean the gap of the component in a direction parallel to one side 101c of the first lower substrate 101. The first upper semiconductor package 21 may have a length equal to or smaller than the first lower semiconductor package 16.

Each conductive terminal 750 may be interposed between the first upper pad 622' and the metal pad 715. The first upper semiconductor package 21 may be electrically connected to the first lower semiconductor package 16 through the conductive terminals 750. The third semiconductor chip 720 may be electrically connected to at least one of the first external terminals 151, the first semiconductor chip 210, and the first passive elements 311 through the first interposer substrate 600' and the first conductive structures 410.

Figure 12A:
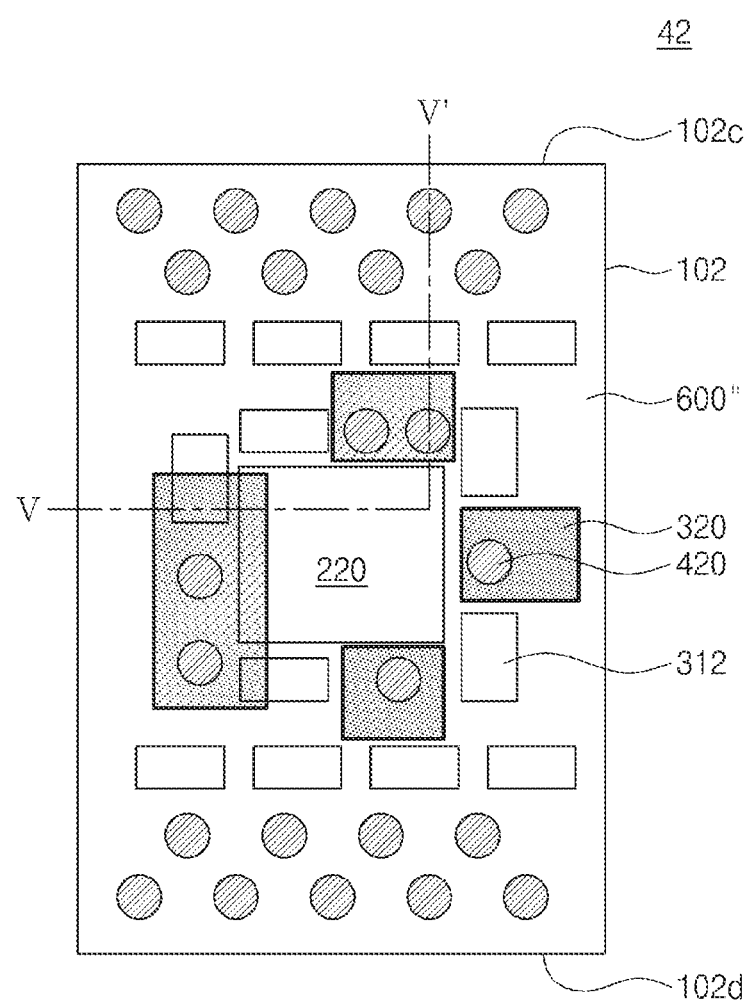
FIG. 12A is a plan view showing a second lower semiconductor package according to embodiments.
Figure 12B:
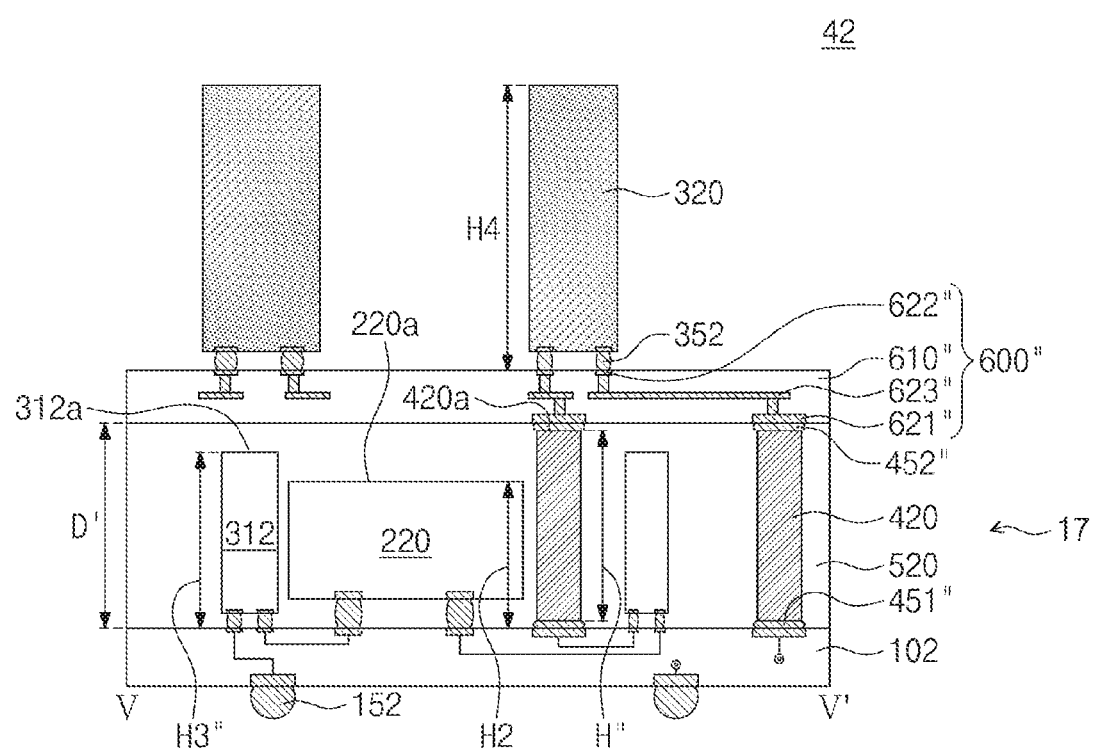
FIG. 12B is a cross-sectional view taken along the line V-V' of FIG. 12A.

FIG. 12A is a plan view showing a second lower semiconductor package according to embodiments. FIG. 12B is a cross-sectional view taken along the line V-V' of FIG. 12A.

Referring to FIGS. 12A and 12B, the second semiconductor package 42 may include a second lower semiconductor package 17 and upper passive elements 320. The second lower semiconductor package 17 includes second external terminals 152, a second lower substrate 102, a second semiconductor chip 220, second conductive structures 420, second passive elements 312, a second lower molding film 520, and a second interposer substrate 600''. The second lower substrate 102, the second external terminals 152, the second semiconductor chip 220, and the second conductive structures 420 may be substantially identical to the lower substrate 100, the second semiconductor chip 220, and the second conductive structures 420, described in the examples of FIGS. 5A, 5B, 6A, and 6B, respectively. The second passive elements 312 may be substantially identical to the passive elements 310 on the second region R2 of the lower substrate 100 described in the example of FIGS. 5A, 5B, 6A, and 6B. For example, at least one of the upper surfaces 312a of the second passive elements 312 may be provided at a higher level than the upper surface 220a of the second semiconductor chip 220. The height H3" of at least one of the mounted second passive elements 312 may be greater than the height H2 of the mounted second semiconductor chip 220.

At least some of the second conductive structures 420 may be disposed adjacent to one side 102c and the other side 102d of the second lower substrate 102. One side 102c and the other side 102d of the second substrate 102 may be opposed to each other. Other some of the second conductive structures 420 may be provided adjacent to the second semiconductor chip 220. For example, other some of the second conductive structures 420 may be provided between the second semiconductor chip 220 and one of the second passive elements 312 or between the second passive elements 312. The upper surface 420a of the second conductive structures 420 may be provided at the same or higher level than the upper surfaces 312a of the second passive elements 312 and the upper surface 220a of the second semiconductor chip 220. The height H" of the second conductive structures 420 may be equal to or greater than the height H3" of the mounted second passive elements 312.

Second lower solder connection portions 451" may be provided between the second lower substrate 102 and the second conductive structures 420, and second upper solder connection portions 452" may be provided between the second conductive structures 420 and the second interposer substrate 600". The second lower solder connection portions 451" and the second upper solder connection portions 452" may be identical to the lower solder connection portions 451 and the upper solder connection portions 452, respectively, which are described with reference to FIGS. 1A and 1B.

The second conductive structures 420 may include power supply structures. The external voltage is transmitted to the second conductive structure 420 through the second external terminals 152, the second lower substrate 102, the second passive elements 312, and the second semiconductor chip 220.

The second interposer substrate 600" includes a second insulating layer 610", a second lower pad 621", a second conductive pattern 623", and a second upper pad 622". The second insulating layers 610", the second lower pad 621", the second conductive pattern 623", and the second upper pad 622" may be similar to the insulating layers 610, the lower pad 621, the conductive pattern 623, and the upper pad 622 of FIGS. 1A and 1B, respectively. However, the second interposer substrate 600" may be connected to the second conductive structures 420. The second upper pad 622" of the second interposer substrate 600" may function as a power supply pad.

The second lower molding film 520 may fill the gap between the second lower substrate 102 and the second interposer substrate 600", and seal the second semiconductor chip 220 and the second passive elements 312.

The upper passive element 320 may be provided on the second lower semiconductor package 17. For example, the upper passive element 320 may be mounted on the upper surface of the second interposer substrate 600". The second connection terminal 352 may be interposed between the second interposer substrate 600" and the upper passive element 320 and may be connected to the second upper pad 622. The upper passive element 320 may be connected to at least one of the second semiconductor chip 220, the second passive elements 312, and the second external terminals 152 through the second interposer substrate 600", the second conductive structure 420, and the second lower substrate 102. The upper passive element 320 may overlap with at least one of the second conductive structures 420 in plan view. Thus, the length of an electrical path between the upper passive element 320 and the second semiconductor chip 220, between the upper passive element 320 and the second passive elements 312, or between the upper passive element 320 and the second external terminals 152 may be reduced. The electrical path may be a power path. The height H4 of the mounted upper passive element 320 may be greater than the gap D' between the second lower substrate 102 and the second interposer substrate 600".

Figure 13A:
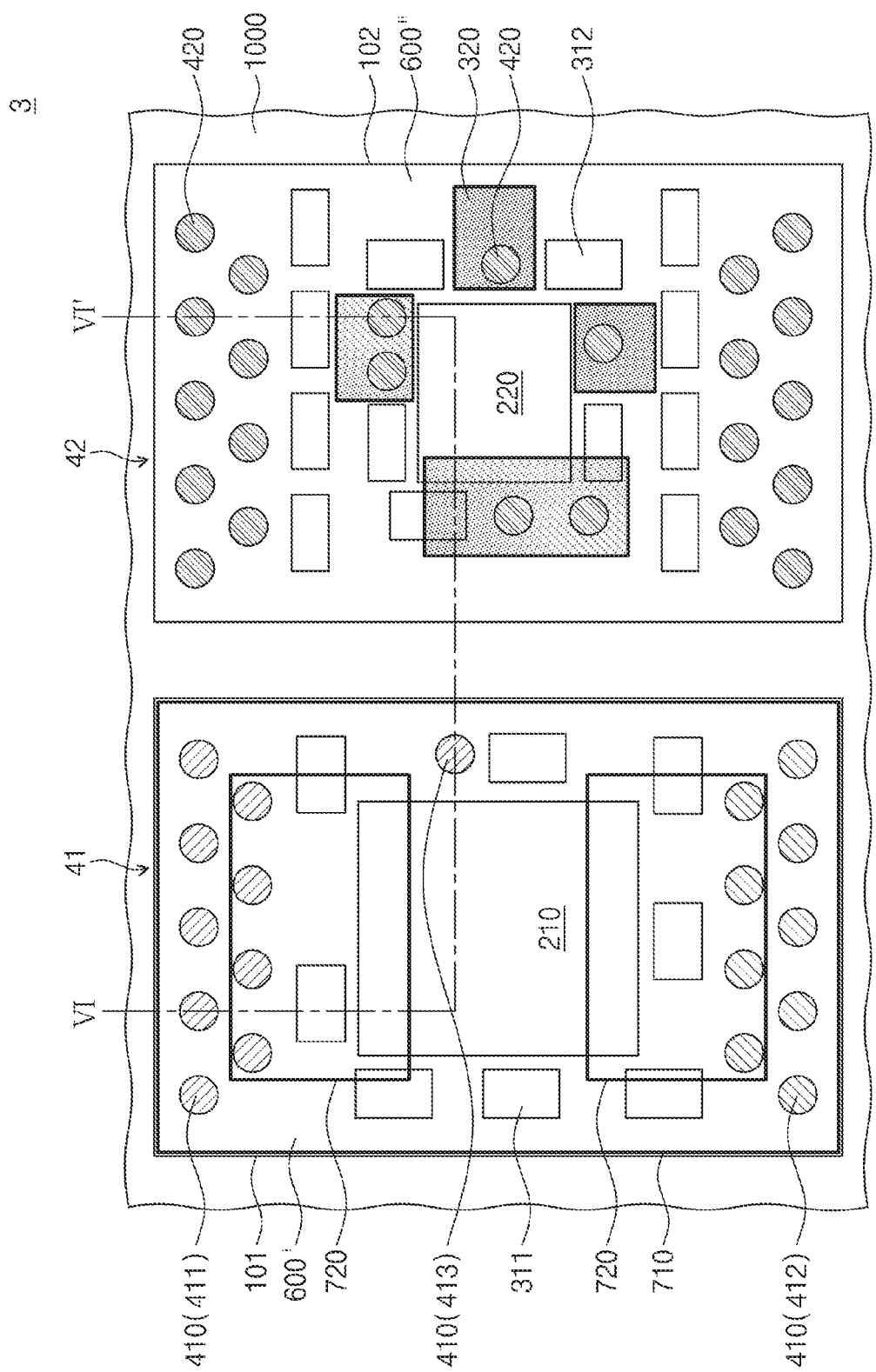
FIG. 13A is a plan view showing a semiconductor module according to embodiments.
Figure 13B:
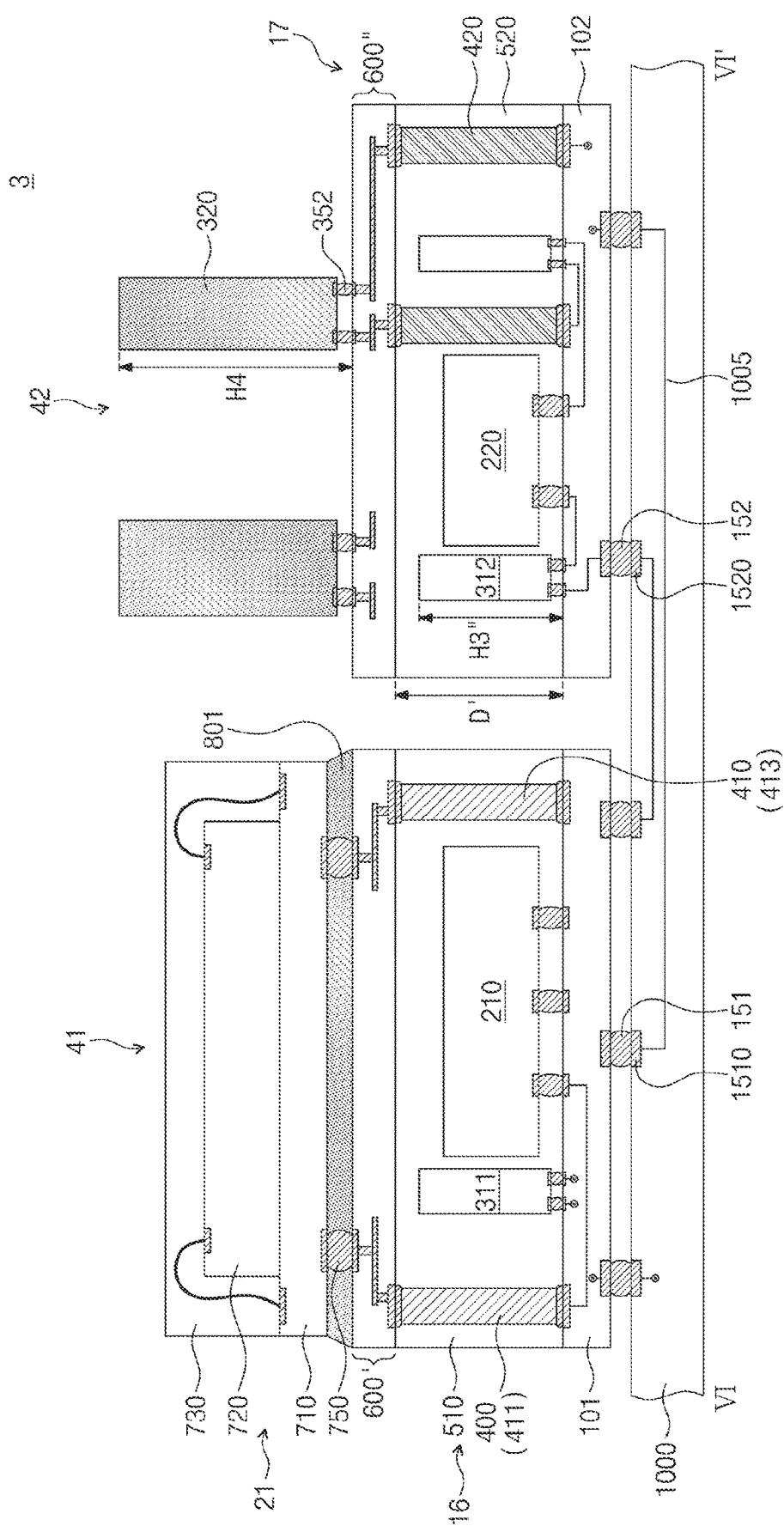
FIG. 13B is a cross-sectional view taken along the line VI-VI' of FIG. 13A.

FIG. 13A is a plan view showing a semiconductor module according to embodiments. FIG. 13B is a cross-sectional view taken along the line VI-VI' of FIG. 13A.

Referring to FIGS. 13A and 13B, the semiconductor module 3 may include a board 1000, a first semiconductor package 41, and a second semiconductor package 42. The board 1000 may have first connection pads 1510 and second connection pads 1520 on its upper surface. The second connection pads 1520 may be spaced apart from the first connection pads 1510. Any one of the second connection pads 1520 may be electrically connected to any one of the first connection pads 1510 through the connection wiring 1005 in the board 1000.

The first semiconductor package 41 may be the same as that described with reference to FIGS. 11C and 11D. The first external terminals 151 are respectively connected to the first connection pads 1510 by the reflow process so that the first semiconductor package 41 may be mounted on the board 1000.

The second semiconductor package 42 may be the same as that described with reference to FIGS. 12A and 12B. The second semiconductor package 42 may be spaced apart from the first semiconductor package 41. The second external terminals 152 are respectively connected to the second connection pads 1520 by the reflow process so that the second semiconductor package 42 may be mounted on the board 1000. The first semiconductor package 41 and the second semiconductor package 42 may be electrically connected to each other through the connection wiring 1005 of the board 1000. For example, the voltage converted in the second semiconductor chip 220 of the second semiconductor package 42 may be supplied to the first semiconductor chip 210 or the third semiconductor chip 720 of the first semiconductor package 41 through the board 1000.

After the first semiconductor package 41 is mounted on the board 1000, an underfill pattern 801 may be formed between the first lower semiconductor package 16 and the first upper semiconductor package 21. The underfill pattern 801 may seal the conductive terminal 750. The underfill pattern 801 may not extend onto the lower surface of the first lower substrate 101. The underfill pattern 801 includes an insulating polymer and may have a higher thermal conductivity than that of air. As another example, the underfill pattern 801 may not be formed.

According to inventive concepts, conductive structures are provided between the lower substrate and the interposer substrate, such that the distance between the lower substrate and the interposer substrate may be large enough to provide a passive element. Thus, a passive element may be mounted on the lower substrate. The electrical path between the passive element and the semiconductor chips may be shortened. The conductive structures have a fine pitch, so that the semiconductor package may be miniaturized.

Although some example embodiments of inventive concepts have been described, it is understood that inventive concepts should not be limited to these embodiments but various changes and modifications may be made by one ordinary skilled in the art within the spirit and scope of inventive concepts as hereinafter claimed.

What is claimed is:
1. A semiconductor package comprising:
   a substrate;
   a first semiconductor chip and a second semiconductor chip on the substrate, the first semiconductor chip including one or more logic circuits, the second semiconductor chip being spaced apart from the first semiconductor chip, and the second semiconductor chip including one or more power management integrated circuits;

a passive element on the substrate, the passive element being spaced apart from the first semiconductor chip and the second semiconductor chip, the passive element being between the first semiconductor chip and the second semiconductor chip, a height of the passive element being greater than a height of the first semiconductor chip and a height of the second semiconductor chip;

a conductive structure on the substrate;

an interposer substrate on the first semiconductor chip, the passive element, and the conductive structure, the interposer substrate being electrically connected to the conductive structure; and an upper passive element on the interposer substrate, wherein a height of the upper passive element is greater than a gap between the substrate and the interposer substrate, wherein the conductive structure includes signal structures and power supply structures, wherein the signal structures are more adjacent to the first semiconductor chip than the power supply structures; and wherein the power supply structures are more adjacent to the second semiconductor chip than the signal structures.

2. The semiconductor package of claim 1, further comprising:

a solder connection portion between the conductive structure and the interposer substrate.

3. The semiconductor package of claim 2, wherein a melting point of the conductive structure is greater than a melting point of the solder connection portion.

4. The semiconductor package of claim 1, wherein a height of the conductive structure is greater than the height of the passive element.

5. The semiconductor package of claim 1, wherein the interposer substrate is on the second semiconductor chip.

6. The semiconductor package of claim 1, further comprising:

an upper package on the interposer substrate, wherein the upper passive element is spaced apart from the upper package.

7. The semiconductor package of claim 1, further comprising:

a plurality of conductive structures on the substrate, wherein the passive element is one passive element among a plurality of passive elements on the substrate, the plurality of conductive structures include the conductive structure, at least one of the plurality of conductive structures is between the first semiconductor chip and the one passive element, between the second semiconductor chip and the one passive element, or between two adjacent passive elements among the plurality of passive elements.

8. A semiconductor package comprising:

a substrate having a first region and a second region;

a first semiconductor chip on the first region of an upper surface the substrate and including logic circuits; and a second semiconductor chip on the second region of the upper surface of the substrate and including power management integrated circuits, the second semiconductor chip being spaced apart from the first semiconductor chip;

a passive element on the upper surface of the substrate, the passive element being spaced apart from the first semiconductor chip and the second semiconductor chip;

an interposer substrate on the first semiconductor chip and the passive element;

a conductive structure including signal structure and power supply structures between the substrate and the interposer substrate;

a lower solder connection portion between the substrate and the conductive structure;

an upper solder connection portion between the conductive structure and the interposer substrate; and an upper passive element on an upper surface of the interposer substrate, wherein a height of the upper passive element is greater than a gap between the substrate and the interposer substrate, wherein a number of the signal structures in the first region of the substrate is greater than a number of the power supply structures in the first region of the substrate, and wherein a number of the power supply structures in the second region of the substrate is greater than a number of the signal structures in the second region of the substrate.

9. The semiconductor package of claim 8, wherein an upper surface of the passive element is at a higher level than an upper surface of the first semiconductor chip and an upper surface of the second semiconductor chip.

10. The semiconductor package of claim 8, wherein a melting point of the conductive structure is greater than a melting point of the lower solder connection portion, and the melting point of the conductive structure is greater than a melting point of the upper solder connection portion.

11. The semiconductor package of claim 8, wherein the interposer substrate is on the second semiconductor chip.

12. The semiconductor package of claim 8, further comprising:

an upper package on an upper surface of the interposer substrate, the upper package including a third semiconductor chip, wherein the third semiconductor chip is configured to perform a function that is different than a function of the first semiconductor chip and a function of the second semiconductor chip.

13. The semiconductor package of claim 8, wherein the height of the upper passive element is greater than a height of the passive element.

14. A semiconductor package comprising:

a substrate having a first region and a second region;

a first semiconductor chip on the first region of an upper surface the substrate and including logic circuits;

a second semiconductor chip on the second region of the upper surface of the substrate, the second semiconductor chip being spaced apart from the first semiconductor chip, and the second semiconductor chip including one or more power management integrated circuits;

a passive element on the upper surface of the substrate, the passive element being spaced apart from the first semiconductor chip and the second semiconductor chip, an upper surface of the passive element being at a higher level than an upper surface of the first semiconductor chip and an upper surface of the second semiconductor chip;

a conductive structure including signal structures and power supply structures on the substrate;

an interposer substrate on the first semiconductor chip, the passive element, and the conductive structure, the interposer substrate being electrically connected to the conductive structure;

a lower solder connection portion between the substrate and the conductive structure, the lower solder connection portion being connected to the substrate and the conductive structure; and an upper passive element on an upper surface of the interposer substrate, wherein a height of the upper passive element is greater than a gap between the substrate and the interposer substrate, wherein a number of the signal structures in the first region of the substrate is greater than a number of the power supply structures in the first region of the substrate, and wherein a number of the power supply structures in the second region of the substrate is greater than a number of the signal structures in the second region of the substrate.

15. The semiconductor package of claim 14, wherein an upper surface of the conductive structure is at a higher level than the upper surface of the passive element.

16. The semiconductor package of claim 14, further comprising:

an upper solder connection portion between the conductive structure and the interposer substrate.

\* \* \* \* \*